United States Patent
Lehman et al.

(10) Patent No.: US 9,377,173 B2
(45) Date of Patent: Jun. 28, 2016

(54) LED LUMINAIRE ASSEMBLY

(75) Inventors: Gregg Arthur Lehman, Peachtree City, GA (US); Anthony James Carney, Fayetteville, GA (US); Ellis Patrick, Sharpsburg, GA (US); Chun Wah Chan, Peachtree City, GA (US); Christopher Ladewig, Fayetteville, GA (US); Timothy Glen Wright, Peachtree City, GA (US); Christopher Michael Bryant, Social Circle, GA (US); Victor Diegues, Senoia, GA (US)

(73) Assignee: Cooper Technologies Company, Houston, TX (US)

( * ) Notice: Subject to any disclaimer, the term of this patent is extended or adjusted under 35 U.S.C. 154(b) by 513 days.

(21) Appl. No.: 13/092,039

(22) Filed: Apr. 21, 2011

(65) Prior Publication Data

US 2011/0310600 A1 Dec. 22, 2011

Related U.S. Application Data

(60) Provisional application No. 61/326,552, filed on Apr. 21, 2010, provisional application No. 61/330,687, filed on May 3, 2010.

(51) Int. Cl.
*F21V 29/00* (2015.01)
*F21V 5/00* (2015.01)
(Continued)

(52) U.S. Cl.
CPC . *F21V 5/007* (2013.01); *F21K 9/30* (2013.01); *F21K 9/90* (2013.01); *F21V 29/763* (2015.01);
(Continued)

(58) Field of Classification Search
CPC .............................. F21V 29/002; F21V 29/00
USPC .............. 362/97.1, 97.3, 217.1, 217.14, 225, 362/249.02, 249.06, 249.14, 237, 331
See application file for complete search history.

(56) References Cited

U.S. PATENT DOCUMENTS 4,237,526 A * 12/1980 Wood ............................ 362/158
7,131,758 B2 * 11/2006 Ishida ........................... 362/545
(Continued)

FOREIGN PATENT DOCUMENTS

| DE | 20018865 | 2/2001 |
|----|----------|--------|
| EP | 1998105 | 12/2008 |
| WO | WO 2004022874 | 3/2004 |

OTHER PUBLICATIONS

Genesis Area Lighting System, Beacon Products, Product Specification, May 3, 2010.
(Continued)

*Primary Examiner* — Robert May
*Assistant Examiner* — Bryon T Gyllstrom
(74) *Attorney, Agent, or Firm* — King & Spalding LLP

(57) ABSTRACT

A light emitting diode (LED) module having a configurable LED substrate capable of receiving varying numbers and layouts of LEDs are described herein. The LED substrate includes LED coupling points for receiving the LEDs and electrical traces etched into the substrate for routing power to the LEDs. The LED module can include a multi-LED over-optic having multiple over-optics that are configured to match the number and configuration of the LEDs positioned on the substrate. The LED coupling points and over-optics can be arranged symmetrically to enable the LED module to be rotated to adjust the light output distribution and direction. The LED module can include a power connection mechanism, for example located at the center of the substrate, that also allows the LED module to be rotated. One or more of the LED modules may be mounted on a heat sink and incorporated into a light fixture.

24 Claims, 17 Drawing Sheets

(51) Int. Cl.

| | | |
|---|---|---|
| *F21K 99/00* | (2016.01) | |
| *F21V 29/76* | (2015.01) | |
| *F21V 17/10* | (2006.01) | |
| *F21V 17/12* | (2006.01) | |
| *F21Y 101/02* | (2006.01) | |
| *F21Y 105/00* | (2016.01) | |
| *F21Y 113/00* | (2016.01) | |
| *H05K 1/02* | (2006.01) | |

(52) U.S. Cl.
  CPC .............. *F21V 17/101* (2013.01); *F21V 17/12* (2013.01); *F21Y 2101/02* (2013.01); *F21Y 2105/001* (2013.01); *F21Y 2113/005* (2013.01); *H05K 1/0287* (2013.01); *H05K 2201/10106* (2013.01)

(56) References Cited

U.S. PATENT DOCUMENTS

| | | | | |
|---|---|---|---|---|
| 7,360,924 | B2* | 4/2008 | Henson et al. | 362/241 |
| 7,566,147 | B2* | 7/2009 | Wilcox et al. | 362/249.02 |
| 7,611,263 | B2* | 11/2009 | Huang et al. | 362/249.02 |
| 7,621,655 | B2* | 11/2009 | Roberts et al. | 362/249.02 |
| 7,677,768 | B2* | 3/2010 | Huang et al. | 362/294 |
| 2005/0073840 | A1 | 4/2005 | Chou et al. | |
| 2005/0130717 | A1* | 6/2005 | Gosieski et al. | 455/575.2 |
| 2006/0098438 | A1* | 5/2006 | Ouderkirk et al. | 362/294 |
| 2006/0139942 | A1* | 6/2006 | Pond et al. | 362/545 |
| 2006/0279962 | A1 | 12/2006 | Loh | |
| 2008/0043457 | A1 | 2/2008 | Braxson | |
| 2008/0101071 | A1* | 5/2008 | Imai et al. | 362/294 |
| 2009/0168399 | A1* | 7/2009 | Kim et al. | 362/84 |
| 2009/0257224 | A1 | 10/2009 | Huang et al. | |
| 2009/0267533 | A1 | 10/2009 | Lee | |
| 2009/0290345 | A1* | 11/2009 | Shaner | 362/249.01 |
| 2009/0316409 | A1* | 12/2009 | Kim et al. | 362/249.14 |
| 2009/0323330 | A1* | 12/2009 | Gordin et al. | 362/235 |
| 2010/0053496 | A1* | 3/2010 | Park et al. | 349/61 |
| 2010/0067229 | A1* | 3/2010 | Scotch et al. | 362/241 |

OTHER PUBLICATIONS

International Search Report and Written Opinion for PCT/2011/033492, issued on Oct. 31, 2011.

European Search Report for Application No. 11772731.3, mailed Feb. 5, 2015.

* cited by examiner

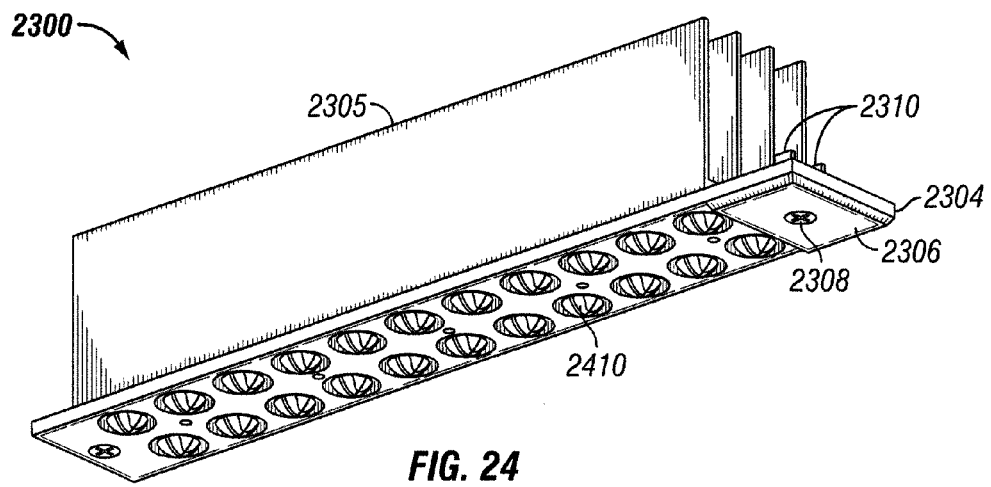
FIG. 24
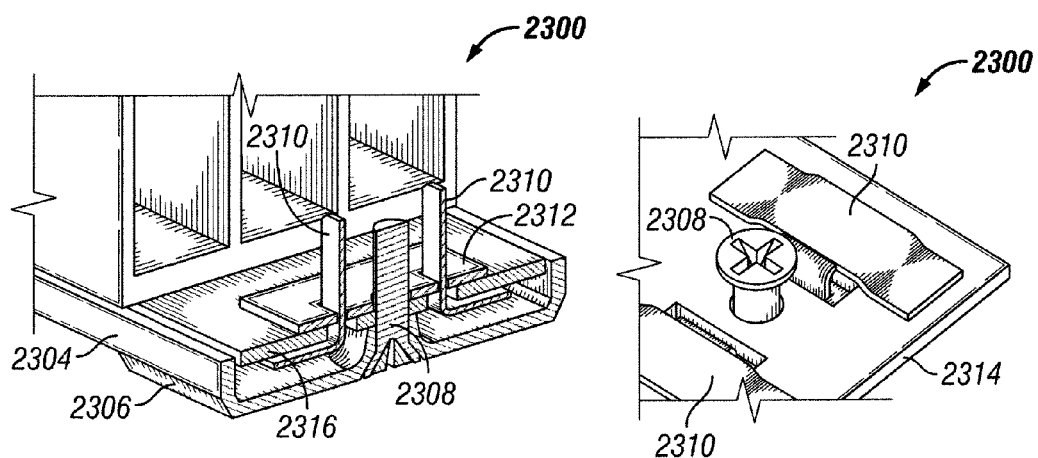
FIG. 25    FIG. 26

LED LUMINAIRE ASSEMBLY

RELATED APPLICATIONS

This application claims priority under 35 U.S.C. §119 to U.S. Provisional Patent Application No. 61/326,552, titled Systems, Methods, and Devices for Connecting a Light Module to a Power Supply," filed on Apr. 21, 2010, and U.S. Provisional Patent Application No. 61/330,687, titled "Systems, Methods, and Devices for an Expandable LED Board Architecture," filed on May 3, 2010. Each of the forgoing priority applications is hereby fully incorporated herein by reference.

TECHNICAL FIELD

The present disclosure relates generally to substrates for mounting and providing power to light emitting diodes (LEDs). More specifically, the embodiments of the invention relate to systems, methods, and devices for providing a traced substrate capable of receiving varying numbers and layouts of LEDs thereon and for providing an improved electrical power connection for the LEDs.

BACKGROUND

The use of LEDs in place of conventional incandescent, fluorescent, and neon lamps has a number of advantages. LEDs tend to be less expensive and longer lasting than conventional incandescent, fluorescent, and neon lamps. In addition, LEDs are generally more efficient and can output more light per watt of electricity than incandescent, fluorescent, and neon lamps.

However, LED fixtures tend to be more expensive to manufacture than incandescent and fluorescent fixtures. One reason for that is because most LED-based solutions are application specific. As such, each solution typically requires its own printed circuit board (PCB) with the LEDs already positioned thereon to provide the desired light output or power usage requirements. The result is an extremely high and varying number of PCB sizes and layouts that must be kept in stock to meet the varying requirements of particular lighting applications.

Furthermore, over-optics are typically used with the LEDs on the PCBs to distribute the light emitted by the LEDs. In some applications, these over-optics are individually coupled or positioned over each discrete LED on the PCB. Alternatively, a single over-optic is positioned over all of the LEDs on the PCB. At times, lighting designers desire to adjust the direction of the light being emitted through the over-optic without completely replacing the over-optic. This typically requires individually repositioning each of the over-optics with respect to their respective LEDs. This is time consuming, expensive, and difficult to replicate on a consistent basis, resulting in varied light output from fixture to fixture and from LED to LED.

SUMMARY

A novel LED module includes a configurable LED substrate capable of receiving, holding, and providing power to varying numbers and layouts of LEDs. The configurable LED substrate can include a multitude of LED coupling points for receiving the LEDs. The substrate also can include electrical traces for routing power to the LED coupling points and ultimately to the LEDs. In one embodiment, the electrical traces are etched into the configurable LED substrate.

The LED module also can include a multi-LED over-optic having multiple discrete over-optics that cover LEDs coupled to the configurable LED substrate and distribute light output by the LEDs. The multi-LED over-optic can be configured such that the over-optics match the number and layout of the LEDs or LED coupling points on the configurable LED substrate. The LED coupling points and the over-optics can be arranged symmetrically to enable the LED module to be rotated about its center. In some embodiments, the LED coupling points and over-optics are configured to allow the LED module to be rotated in successive 90 degree steps wile maintaining the same LED arrangement.

The LED module can include a power connection means that also allows for rotation of the LED module or the rotation of the configurable LED substrate. In one embodiment, the configurable LED substrate includes an aperture generally at its center for passing electrical conductors from a power source to electrical leads coupled to the configurable LED substrate, and ultimately to the electrical traces and LEDs coupled to the LED coupling points. In another embodiment, electrical contacts are disposed on at least one side of the LED module to make contact with electrical contacts of a bus bar. The LED module can include contacts on more than one lateral side to allow for rotation of the LED module while still receiving power from the bus bar.

In one embodiment, a light module includes a substrate and at least one electrical trace disposed on the substrate. The light module also can include LED coupling points. Each LED coupling point can include an electrical contact coupled to the electrical trace. The light module also can include a multi-LED over-optic having a multitude of discrete over-optics.

In another embodiment, a method for manufacturing an LED light module includes providing a substrate for receiving LEDs. At least one electrical trace can be etched onto a surface of the substrate. The at least one electrical trace can be electrically coupled to a multitude of LED connection points. Each LED connection point can be configured to electrically couple to an LED. A multitude of LEDs can be coupled to at least a portion of the LED connection points.

These and other aspects, objects, features, and advantages of the exemplary embodiments will become apparent to those having ordinary skill in the art upon consideration of the following detailed description of illustrated exemplary embodiments, which include the best mode of carrying out the invention as presently perceived.

BRIEF DESCRIPTION OF THE DRAWINGS

For a more complete understanding of the exemplary embodiments of the present invention and the advantages thereof, reference is now made to the following description in conjunction with the accompanying drawings in which:

FIG. 24 is another perspective view of the light bar of FIG. 23 in accordance with certain exemplary embodiments of the present invention;

FIG. 25 is a perspective view of a portion of the light bar of FIG. 23, in accordance with certain exemplary embodiments of the present invention;

FIG. 26 illustrates the connection between a connector and a printed circuit board of the light bar of FIG. 23, in accordance with certain exemplary embodiments of the present invention.

Figure 1:
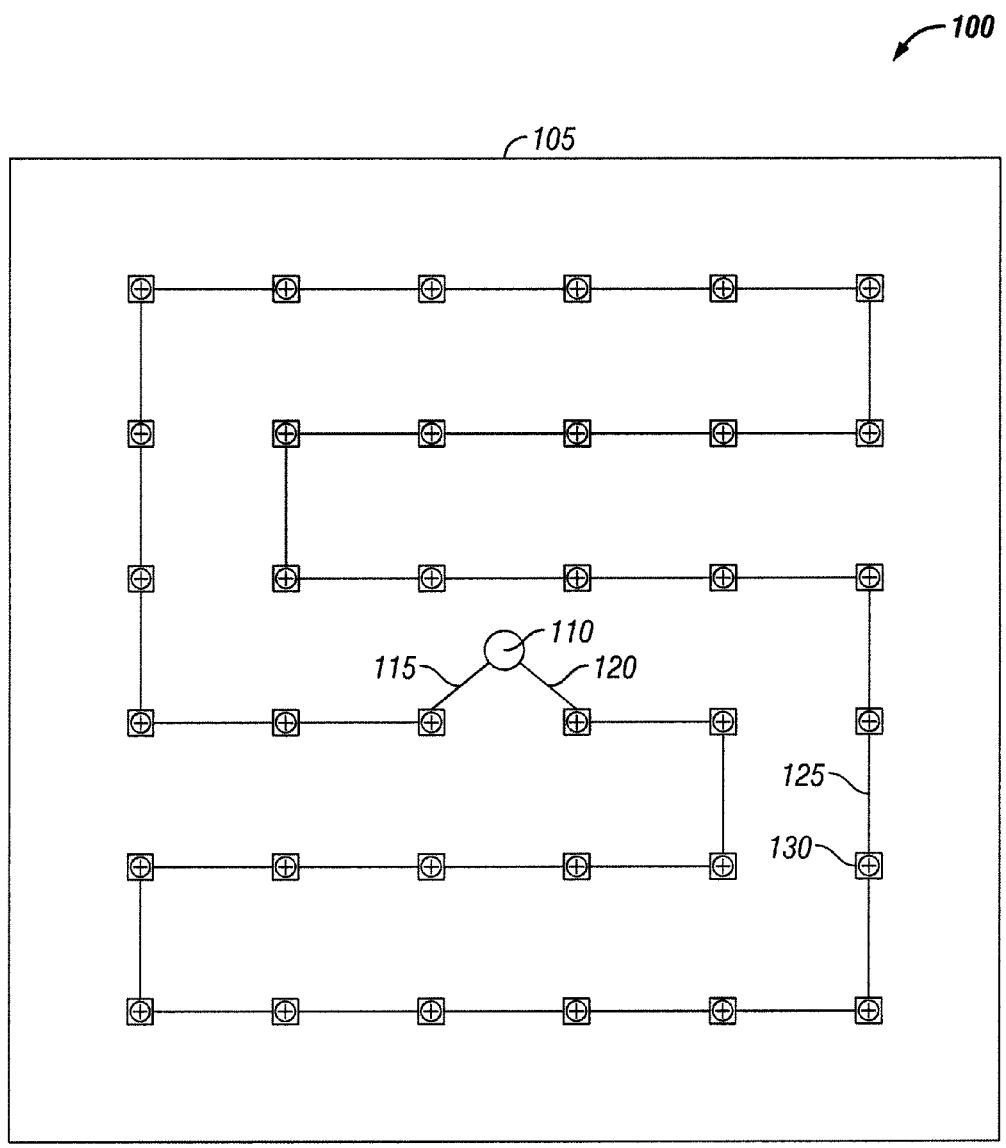
FIG. 1 is a top plan view of an electrical schematic for a configurable LED substrate for a configurable LED module, in accordance with certain exemplary embodiments of the present invention.

The drawings illustrate only exemplary embodiments of the invention and are therefore not to be considered limiting of its scope, as the invention may admit to other equally effective embodiments. The elements and features shown in the drawings are not necessarily to scale, emphasis instead being placed upon clearly illustrating the principles of exemplary embodiments of the present invention. Additionally, certain dimensions may be exaggerated to help visually convey such principles.

DETAILED DESCRIPTION OF EXEMPLARY EMBODIMENTS

Embodiments of the present invention are directed to systems, methods, and devices for providing a traced substrate capable receiving varying numbers and layouts of light emitting diodes (LEDs) thereon. Herein reference may be made to the substrate being configurable. The use of the term "configurable" is intended to refer to the ability to place a variety of different number of LEDs on the substrate and/or placing the LEDs on the substrate in a variety of different configurations. In addition, reference is made herein to a configurable LED module. In certain exemplary embodiments, the term "configurable LED module" refers to the combination of the substrate with a multi-LED over-optic.

In certain exemplary embodiments, all or nearly all possible LED configurations for multiple lighting applications are capable of using a single substrate, such as a printed circuit board (PCB), having all of the electrical traces needed for those configurations etched into the substrate. By including all of the traces for multiple LED layout configurations on a single PCB, a manufacturer can use a single form factor for the PCB and then add different denominations and organizations of LED chips to the board based on application specific requirements, thereby resulting in less stock needing to be kept on hand.

In certain exemplary embodiments, the LEDs on the PCB can be the same or different colors. Providing the ability to include different color LEDs in different amounts and in different configurations alone or along with LEDs emitting "white" light provides the ability to generate different color temperatures from the same base PCB.

In certain exemplary embodiments, the PCB may be square and may further include an optic having multiple discrete over-optics ("multi-LED over-optic") that are configured to match the number and configuration of the LEDs positioned on the PCB. By providing a square PCB, the PCB can be rotated in 90 degree increments to change the direction of distribution of light emitted by the LEDs while still being capable of being coupled in the same space as it was prior to rotation.

In certain exemplary embodiments, a heat sink may be provided that is configured to receive one or more of the exemplary configurable PCBs. That is, the PCB having the LEDs mounted thereon may be mounted or otherwise affixed to a heat sink. The exemplary heat sink may include multiple mounting holes for the PCB to be releasably coupled to the heat sink and further may provide a means for being able to rotate the PCB relative to the heat sink while sill engaging and coupling to the heat sink. In one embodiment, the PCB is rotated in ninety degree increments relative to the heat sink. The heat sink may further include one or more apertures that align with openings in the PCB for passing electrical wires therethrough. These apertures may be positioned in such a manner that the positioning of the apertures does not change when the PCB is rotated in certain increments, such as in ninety degree increments. The heat sink also may include slots that are aligned with mounting holes in the PCB and the multi-LED over-optic for receiving self-tapping screws and further coupling the configurable LED module to the heat sink.

The configurable LED module also may include a power connection module that supports simple installation of the configurable LED module to fixtures while satisfying ingress protection (IP) ratings established to ensure component protection from various environmental ratings (e.g., water, dirt, etc.) and safety of use. For instance, in one embodiment of the invention, the configurable LED module may include one or more connector plugs disposed on the PCB that are electrically coupled to the electrical traces of the PCB. The connector plug(s) can be disposed at or near the center of the LED module to facilitate rotation of the configurable LED module.

The power connection modules described herein provide several advantages over conventional power connectors. For example, the power connection modules may allow for simpler installation of LED modules with light fixture housings, allow for easy replacement of old or defective LED modules, and allow for the modularization of LED modules in a fixture housing with multiple power connection sockets. For instance, in one exemplary embodiment, a fixture may include multiple sockets allowing for a particular configuration of an LED module in a fixture and/or allowing for the addition of other LED modules to the fixture, thereby changing and/or increasing the light output of the fixture incorporating the LED modules.

The following description of exemplary embodiments refers to the attached drawings. Any spatial references herein such as, for example, "upper," "lower," "above," "below," "rear," "between," "vertical," "angular," "beneath," etc., are for the purpose of illustration only and do no limit the specific orientation or location of the described structure.

Referring now to the figures, in which like numerals represent like (but not necessarily identical) elements throughout the figures, exemplary embodiments of the present invention are described in detail. FIG. 1 is a top plan view of an electrical schematic 100 for a configurable LED substrate for a configurable LED module, in accordance with certain exemplary embodiments of the present invention. Referring to FIG. 1, the exemplary electrical schematic 100 includes a substrate 105. The substrate 105 includes one or more sheets of ceramic, metal, laminate, circuit board, mylar, a dielectric material, or another material. In alternative exemplary embodiments, the substrate 105 may or may not include a metallic cover. Examples of the substrate 105 include a PCB and a metal clad printed circuit board (MCPCB).

The substrate 105 includes a multitude of LED connection or coupling points 130. Each LED coupling point 130 is configured to receive at least one LED. Providing multiple LED coupling points 130 allows for the addition of LEDs to the substrate 105 as needed. For example, a manufacturer may have certain products that require thirty-six LEDs, other products that require twenty-four LEDs, and still other products that require sixteen LEDs. The substrate 105 provides a solution for each of those needs without the need to keep three different application specific substrates. Instead, for the product that requires sixteen LEDs, sixteen LEDs can be electrically coupled to the LED coupling points 130 and the remainder of the LED coupling points 130 can be left empty. For the product that needs twenty-four LEDs, twenty-four LEDs can be electrically coupled to twenty-four of the LED coupling points 130 and the remainder of the coupling points 130 can be left empty.

In certain exemplary embodiments, the LED coupling points 130 are positioned approximately one inch apart, center-to-center, and the substrate 105 is approximately 5.75 inches in length and width. In certain exemplary embodiments, the layout of the LED coupling points 130 is symmetrical in such a manner that upon rotating the substrate 105 in successive ninety degree turns, the layout of the LED coupling points 130 will be the same. Therefore, the substrate 105 provides a manufacturer with the flexibility to use the substrate 105 with any number of LEDs up to and including the number of LEDs that would equal the number of LED coupling points 130 on the substrate 105. While the exemplary substrate 105 illustrated in FIG. 1 provides 36 LED coupling points 130 in a 6×6 configuration, the number and layout of LED coupling points 130 and ultimately LEDs coupled thereto is unlimited. For example, substrates having configurations of 16, 24, 25, 49, 50, 75, and 100 LED coupling points 130 are contemplated and within the spirit and scope of this disclosure.

The substrate 105 also includes one or more electrical traces 125 etched thereon. The electrical traces 125 route electrical power to the LED coupling points 130, and ultimately to LEDs coupled to the LED coupling points 130. In the exemplary embodiment of FIG. 1, the electrical traces 125 are arranged in series. Alternatively, the electrical traces 125 may be arranged in parallel and/or the substrate 105 may include multiple sets of electrical traces 125, where each electrical trace 125 separately powers and controls a distinct grouping of LEDs electrically coupled LED coupling points 130 on the substrate 105. Providing multiple electrical traces 125 would allow for separately dimming certain LEDs on the substrate 105 without affecting others. Furthermore, if different color LEDs are placed on the substrate 105, having multiple sets of electrical traces 125 would provide for color rendering index (CRI) control, correlated color temperature (CCT) control, and/or red-green-blue (RGB) control.

Electrical power for the electrical traces 125 is supplied through an aperture 110 in the substrate 105. While the exemplary aperture 110 is positioned at the center of the substrate 105, those of ordinary skill in the art will recognize that alternative positions for providing the electrical connection are feasible anywhere along the substrate surface. Although not shown in FIG. 1, electrical wires connected to a power source are positioned through the aperture 110 and coupled to electrical leads 115 and 120. For example, a first wire can be routed through the aperture 110 to connect a positive terminal of the power source to lead 115 and a second wire can be routed through the aperture 110 to connect a negative terminal of the power source to lead 120.

In certain exemplary embodiments, the electrical leads 115, 120 are each coupled to one of the electrical traces 125 to route power from the power source to each of the LED coupling points 130. Alternatively, each electrical lead 115, 120 is electrically coupled to one of the LED coupling points 130. The electrical traces 125, along with the LED coupling points 130, complete the circuit between the positive terminal of the power source and the negative terminal of the power source to enable current to flow to the LEDs coupled to the LED coupling points 130. For LED coupling points 130 that do not have an LED coupled thereto, a jumper may be used to electrically couple two traces 125 that are coupled to those LED coupling points 130. In this way, the circuit is completed when the substrate 105 is not fully populated with LEDs.

Figure 2:
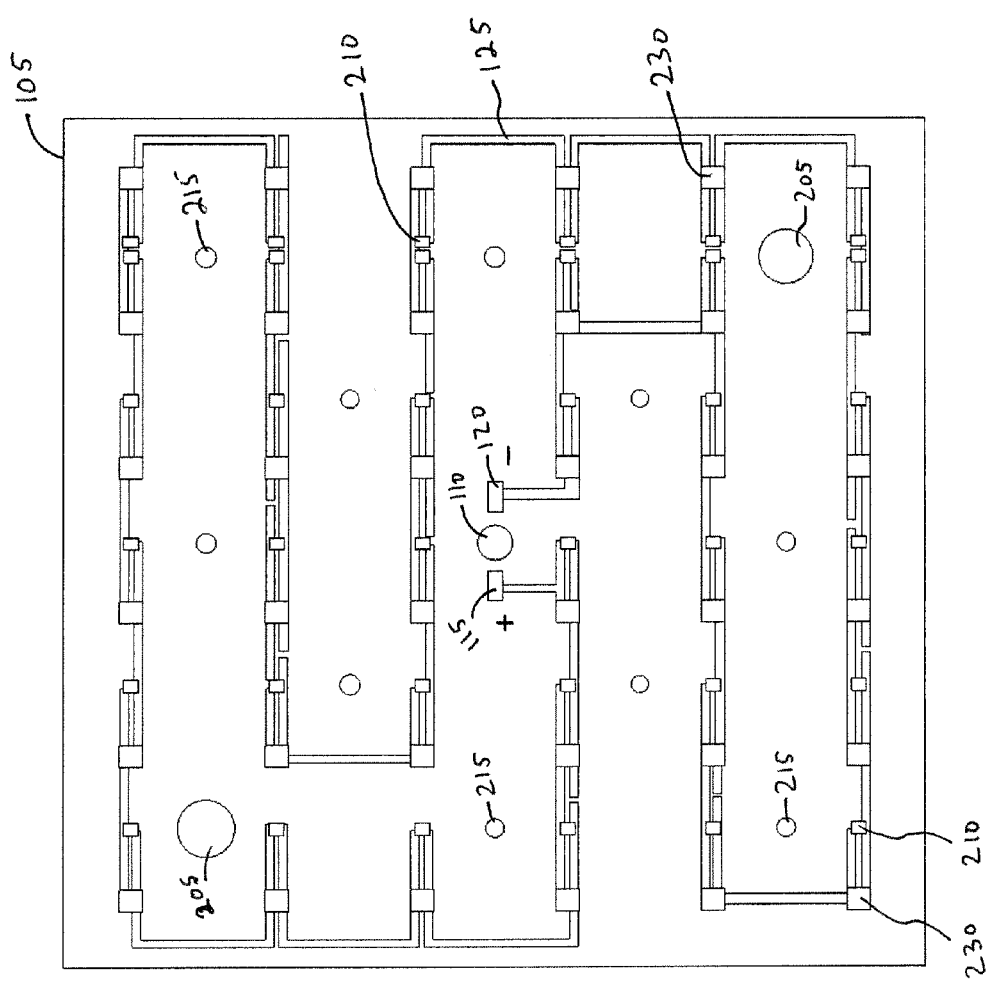
FIG. 2 is a top plan view of a configurable LED substrate with LEDs disposed thereon, in accordance with certain exemplary embodiments of the present invention.
Figure 3:
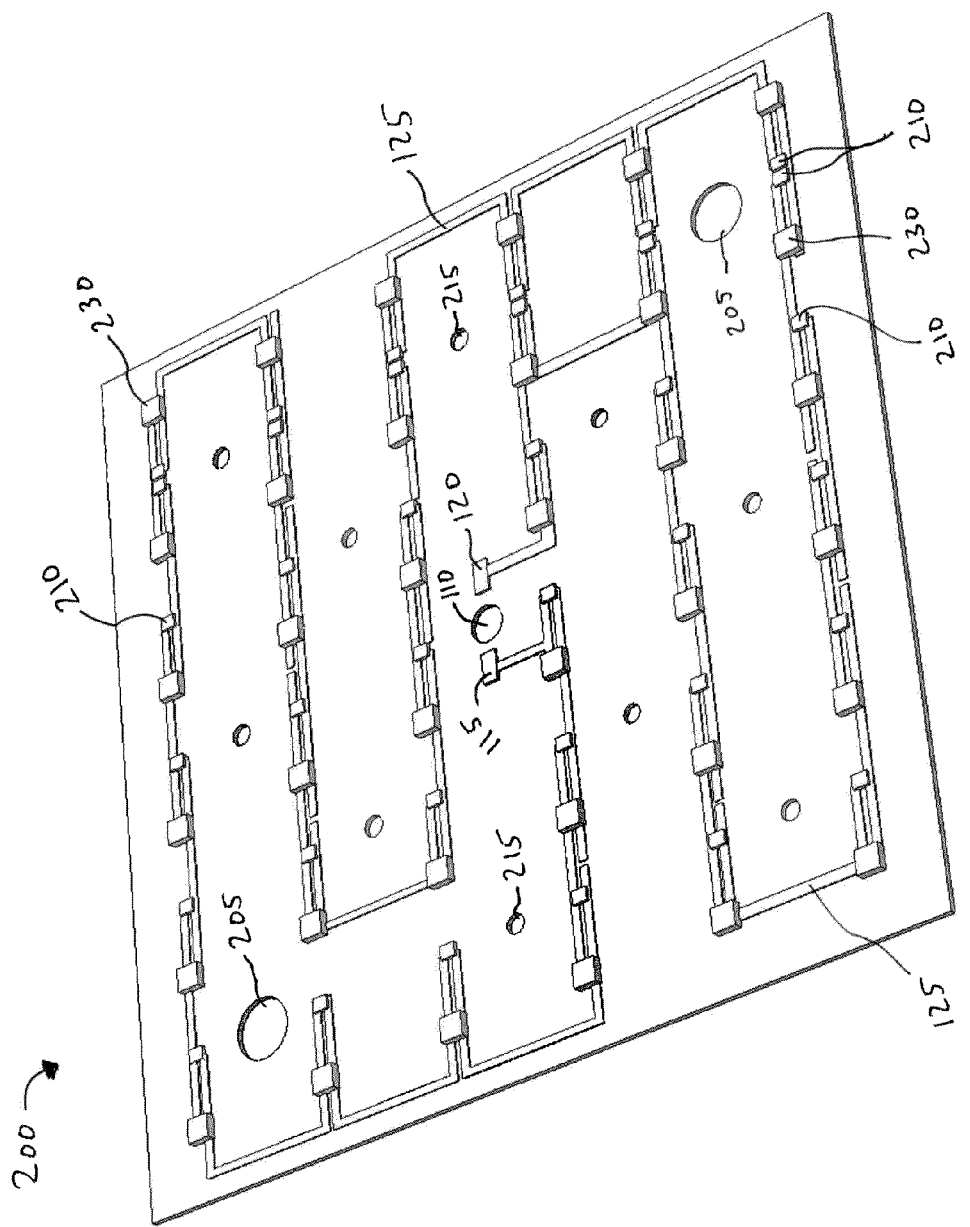
FIG. 3 is a perspective view of the configurable LED substrate of FIG. 2 with LEDs disposed thereon, in accordance with certain exemplary embodiments of the present invention.

FIG. 2 is a top plan view of a configurable LED substrate 200 with LEDs 230 disposed thereon, in accordance with certain exemplary embodiments of the present invention. FIG. 3 presents a perspective view of the configurable LED substrate 200 of FIG. 2. While the exemplary embodiment of FIGS. 2 and 3 present the configurable LED substrate 200 (and ultimately the LED module) as being square-shaped, in alternative embodiments, the configurable LED substrate 200 (and ultimately the LED module) can be any geometric or non-geometric shape, including, but not limited to, round, rectangular, or triangular. Furthermore, while the exemplary embodiment presents the configurable LED substrate 200 and the configurable LED module having the same shape, in alternative embodiments, the shapes of each may be different.

Now referring to FIGS. 2 and 3, the exemplary configurable LED substrate 200 includes multiple LEDs 230 coupled to the substrate 105 at the LED coupling points 130. In certain exemplary embodiments, each LED 230 includes a chip of semi-conductive material that is treated to create a positive-negative ("p-n") junction. When the LED 230 is electrically coupled to a power source, by way of the electrical traces 125 and the leads 115, 120, current flows from the positive side to the negative side of each junction, causing charge carriers to release energy in the form of incoherent light.

The wavelength or color of the emitted light depends on the materials used to fabricate the LED 230. For example, a blue or ultraviolet LED can include gallium nitride (GaN) or indium gallium nitride (InGaN), a red LED can include aluminum gallium arsenide (AlGaAs), and a green LED can include aluminum gallium phosphide (AlGaP). Each of the LEDs 230 can produce the same or a distinct color of light. For example, the LEDs 230 can include one or more white LEDs and one or more non-white LEDs, such as red, yellow, amber, or blue LEDs, for adjusting the CRI, CCT, or RGB output of the light emitted from a fixture in which the configurable LED module having the configurable substrate 200 is installed. A yellow or multi-chromatic phosphor may coat or otherwise be used in a blue or ultraviolet LED to create blue and red-shifted light that essentially matches blackbody radiation. The emitted light approximates or emulates "white," incandescent light to a human observer. In certain exemplary embodiments, the emitted light includes substantially white light that seems slightly blue, green, red, yellow, orange, or some other color or tint. In certain exemplary embodiments, the light emitted from the LEDs 230 has a color temperature between 2500 and 5000 degrees Kelvin.

In certain exemplary embodiments, an optically transmissive or clear material (not shown) encapsulates at least a portion of each LED 230. This encapsulating material provides environmental protection for the LEDs 230 while transmitting light from the LEDs 230. For example, the encapsulating material can include a conformal coating, a silicone gel, a cured/curable polymer, an adhesive, or some other material known to a person of ordinary skill in the art having the benefit of the present disclosure. In certain exemplary embodiments, phosphors are coated onto or dispersed in the encapsulating material for creating white or any other color of light. In certain exemplary embodiments, the white light has a color temperature between 2500 and 5000 degrees Kelvin.

In certain exemplary embodiments, the LEDs 230 are collectively configured to produce a lumen output from 1 lumen to 5000 lumens. The LEDs 230 are attached to the substrate 205 at the LED coupling points 130 by one or more solder joints, plugs, epoxy or bonding lines, and/or other means for mounting an electrical/optical device onto a surface. The LED connection points 130 each provide an electrical connection between the LED 230 attached to the LED connection point 130 and the electrical traces 125. In one example, a first lead of one of the LEDs 230 is electrically coupled to a first electrical trace 125 via a solder joint at one of the LED connection points 130 and a second lead of the one LED 230 is electrically coupled to a second electrical trace 125 via a solder joint at the one LED connection point 130.

Figure 6:
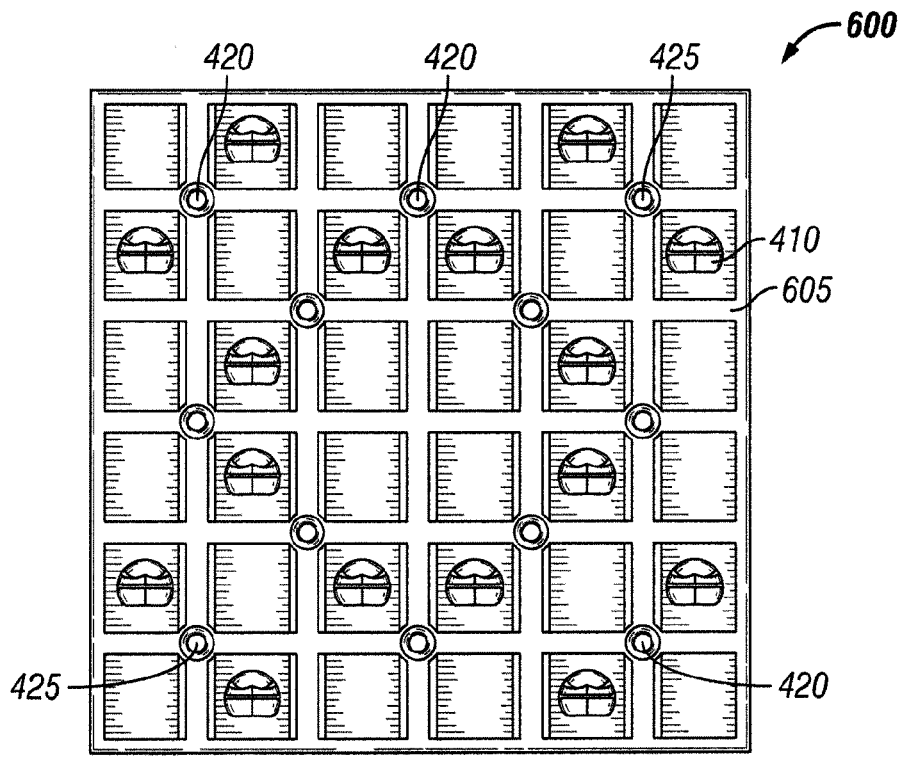
FIG. 6 is a top plan view of an alternative multi-LED over-optic, in accordance with another exemplary embodiment of the present invention.
Figure 7:
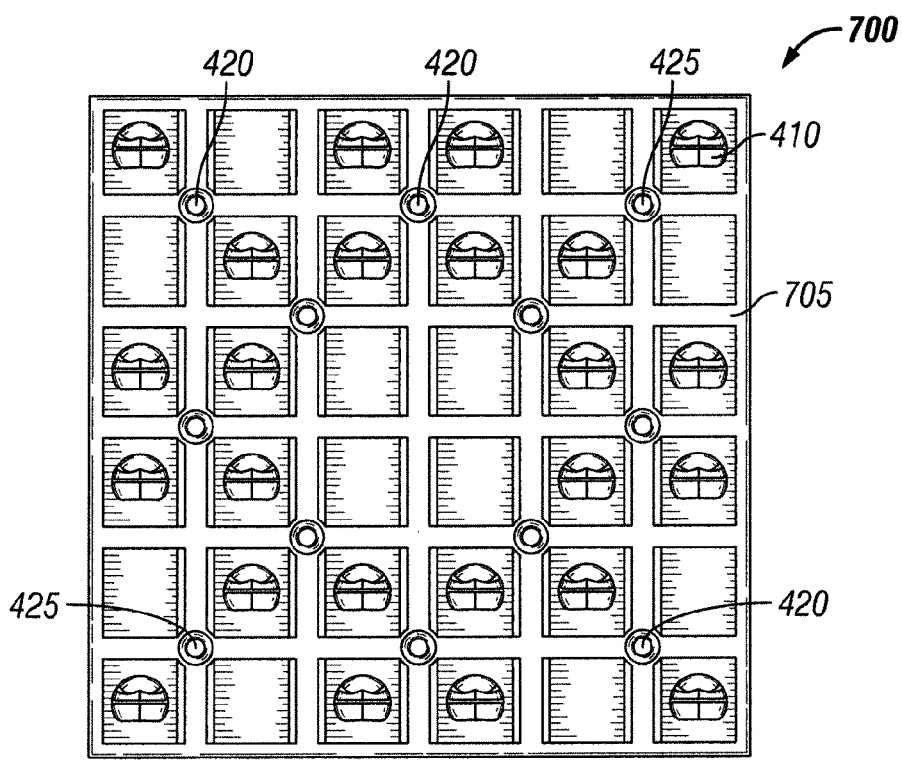
FIG. 7 is a top plan view of yet another alternative multi-LED over-optic, in accordance with another exemplary embodiment of the present invention.

While the exemplary embodiment of FIGS. 2 and 3 present LEDs 230 attached to every one of the LED connection points 130, in alternative embodiments certain LED connection points 130 would not have an LED 230 connected thereto and would not affect the operation of the configurable LED module. For example, there is contemplated configurable LED modules having sixteen LEDs positioned as shown in FIG. 6 (with sixteen LED connection points being unpopulated with LEDs 230), and another configurable LED module having twenty-four LEDs positioned as shown in FIG. 7 (with eight LED connection points being unpopulated with LEDs 230).

The exemplary configurable LED substrate 200 also includes one or more resistors 210. Each resistor 210 is electrically coupled to the electrical traces 125 between two LED connection points 130. The resistors 210 limit the current flowing through the LEDs 230 and thus, the amount of power consumed by the LEDs 230. In certain exemplary embodiments, the resistors 210 are populated when the corresponding LED coupling point 130 is unpopulated with an LED 230. The resistors 210 typically have a low ohmic value to direct current through the resistor 210 in the absence of a populated LED 230. This allows for varying numbers of LEDs 230 to be populated on the configurable LED substrate 200. In certain exemplary embodiments, the resistors 210 have an ohmic value of approximately a short circuit. In certain exemplary embodiments, the resistors 210 are within the range of 0-10 ohms.

The exemplary LED substrate 200 also includes several features for attaching the configurable LED substrate 200 to other objects. For example, the configurable LED substrate 200 includes mounting post receiving apertures 205. In one exemplary embodiment, the mounting post receiving apertures 205 are configured to receive a mounting post (see FIG. 5) therethrough from a multi-LED over-optic, as described with reference to FIG. 5 hereinafter. In addition, the configurable LED substrate 200 includes one or more mounting holes 215. In one exemplary embodiment, the mounting holes 215 are through-holes configured to receive a coupling device, such as a screw or rivet, for coupling a multi-LED over-optic, the configurable LED substrate 200, and potentially a heat sink together. Alternatively, the mounting holes 215 can be threaded or beveled.

Figure 4:
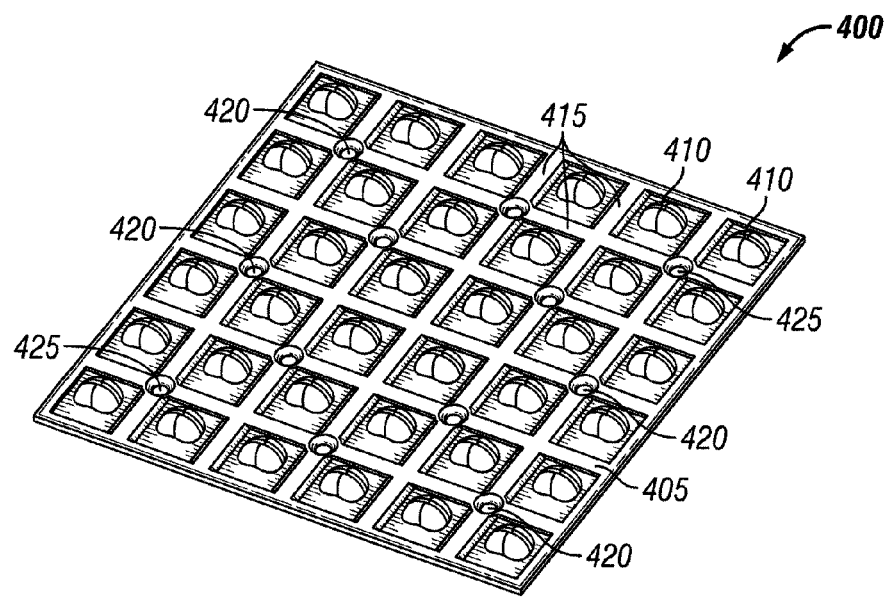
FIG. 4 is a perspective view of a multi-LED over-optic for use in conjunction with the configurable substrate of FIG. 2, in accordance with certain exemplary embodiment of the present invention.
Figure 5:
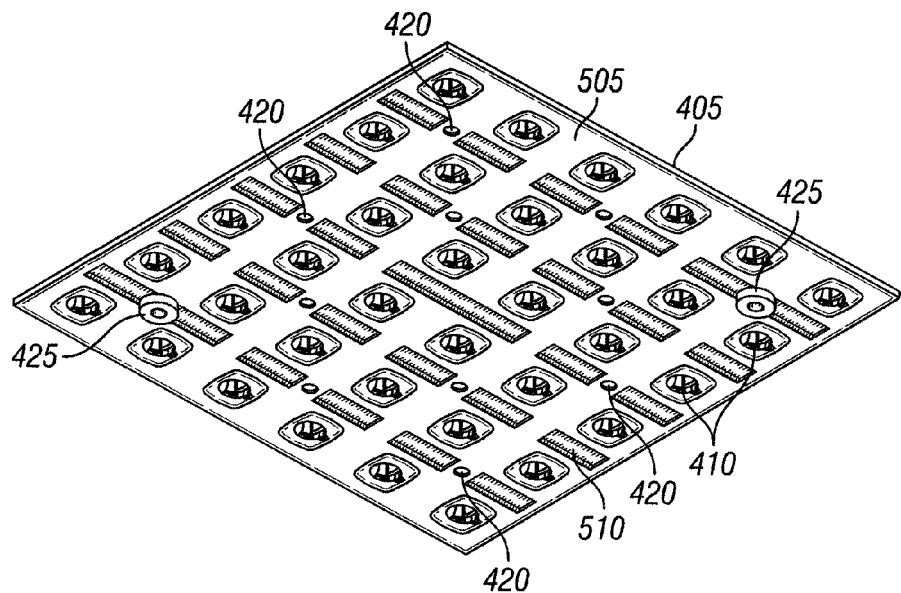
FIG. 5 is a perspective view of a bottom side of the multi-LED over-optic of FIG. 4, in accordance with certain exemplary embodiments of the present invention.

FIG. 4 is a perspective view of a multi-LED over-optic 400 for use in conjunction with the configurable substrate 200 of FIG. 2, in accordance with certain exemplary embodiment of the present invention. FIG. 5 presents a perspective view of the bottom side 505 of the multi-LED over-optic 400. Referring now to FIGS. 1-5, the multi-LED over-optic 400 includes a frame 405 with multiple discrete over-optics 410. In certain exemplary embodiments, the frame 405 and the over-optics 410 are molded from a single piece of acrylic, polycarbonate, or other material. In the exemplary embodiment of FIG. 4, the frame 405 includes thirty-six over-optics 410. Typically, this multi-LED over-optic 400 would be used in conjunction with and/or coupled to a configurable LED substrate 200 having thirty-six LEDs 230 coupled thereto in a matching configuration. That is, each over-optic 410 of the frame would be disposed over one of the LEDs 230 of the configurable LED substrate 200 when the multi-LED over-optic 400 is coupled to or properly disposed over the configurable LED substrate 200.

The frame 405 also includes multiple ribs 415. In certain exemplary embodiments, the ribs 415 are an additional amount of material the frame 405 is molded from, such as acrylic or polycarbonate, and has a thickness greater than the thickness of the material immediately surrounding each individual over-optic 410. The ribs 415 add stiffness and rigidity to the multi-LED over-optic 400. Furthermore, the ribs 415 help to provide sufficient material to allow for one or more counter-sunk mounting holes 420. The mounting holes 420 are configured to receive a coupling device, such as a screw or rivet, therethough to couple the multi-LED over-optic 400 to the configurable LED substrate 200 and/or to a heat sink or other mounting surface. Alternatively or in addition thereto, the multi-LED over-optic 400 may be coupled to the configurable LED substrate 200 with one of acrylic tape, polyester tape, epoxy, RTV silicone sealant, or a gasket to protect the configurable LED substrate 200 from environmental contaminants. Any of the aforementioned devices could be used for instance around the perimeter of the multi-LED over-optic 400 and the configurable LED substrate 200 as well as along the junction points for each of the mounting holes 215, 420 and the aperture 110 for the electrical connections.

Figure 8:
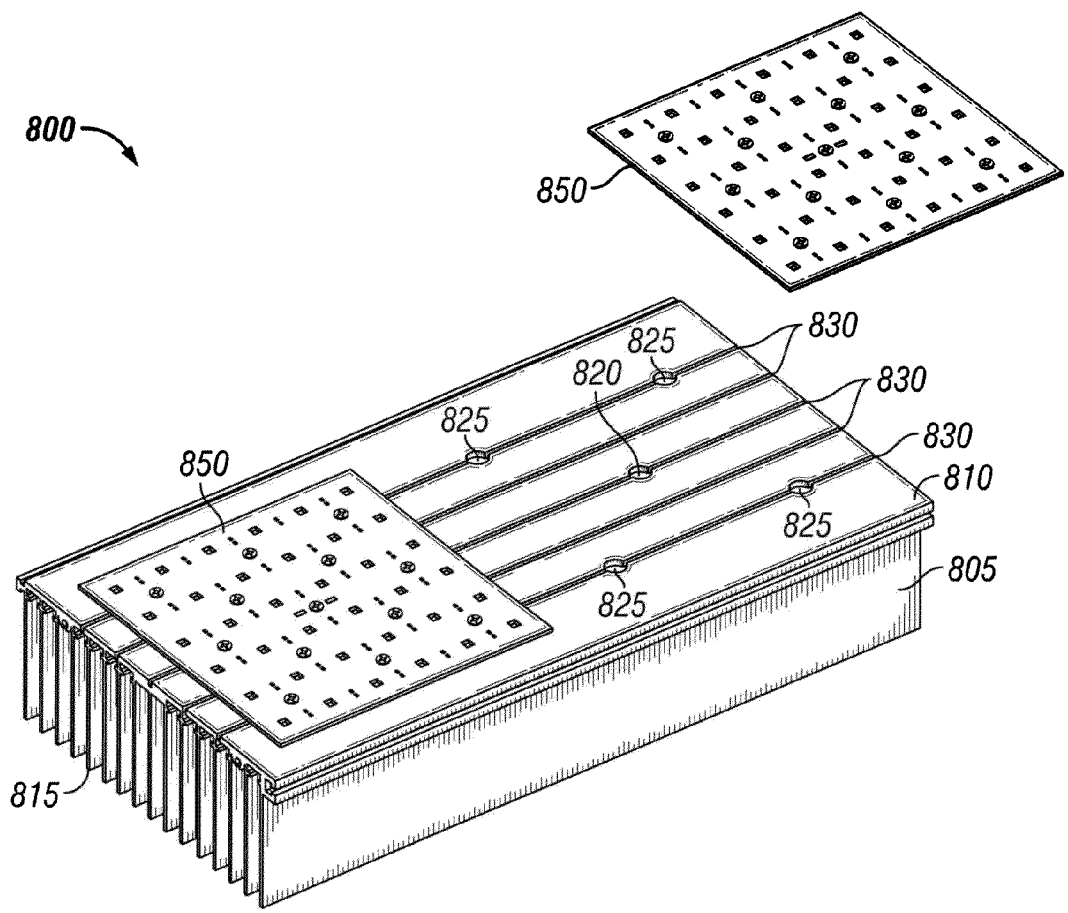
FIG. 8 is a perspective view of light module having a heat sink and one or more configurable LED modules, in accordance with certain exemplary embodiments of the present invention.

In certain exemplary embodiments, the frame 405 also includes one or more mounting posts 425. In one exemplary embodiment, the posts 425 are constructed from the same material as the frame 405. In one embodiment, the frame 405 includes two posts 425 positioned near opposite corners of the frame 405. However, greater or fewer posts can be provided. As best seen in FIG. 5, the posts 425 extend down from the bottom surface 505 of the frame 405. In one exemplary embodiment, the posts 425 extend down approximately 0.080 inches from the bottom surface 505 of the frame 405. Each post 425 is configured to extend through a mounting post receiving aperture 205 of the configurable LED substrate 200 and engage a mounting hole 825 in a heat sink 800 as shown in FIG. 8 or other mounting surface. The bottom surface 505 of the frame 405 also includes one or more recessed linear pockets 510. The recessed linear pockets 510 are positioned and configured such that when the multi-LED over-optic 400 is coupled to or properly disposed over the configurable LED substrate 200, each resistor 210 will be disposed in one of the pockets 510.

FIGS. 6 and 7 present alternative multi-LED over-optics 600 and 700, respectively. Referring to FIG. 6, the alternative multi-LED over-optic 600 includes a frame 605 with sixteen over-optics 410, rather than thirty-six over-optics 410. The over-optics 410 are arranged symmetrically such that the multi-LED over-optic 600 can be rotated in 90 degree increments without altering the arrangement of the over-optics 410. The exemplary multi-LED over optic 600 is configured to be coupled to a configurable LED substrate, for example to a configurable LED substrate that holds sixteen LEDs in the same arrangement as the over-optics 410 of the multi-LED over-optic 600. The multi-LED over-optic 600 includes the same or similar components as the multi-LED over-optic 400 illustrated in FIGS. 4-5 and described above. In particular, the multi-LED over-optic 600 includes ribs 415, mounting holes 420, posts 425, and one or more recessed linear pockets (not shown) disposed on a rear surface of the multi-LED over-optic 600.

Referring to FIG. 7, the alternative multi-LED over-optic 700 includes a frame 705 with twenty-four over-optics 410, rather than thirty-six or sixteen over-optics 410. The over-optics 410 are arranged symmetrically such that the multi-LED over-optic 700 can be rotated in 90 degree increments without altering the arrangement of the over-optics 410. The exemplary multi-LED over-optic 700 is configured to be coupled to a configurable LED substrate, for example to a configurable LED substrate that holds twenty-four LEDs in the same arrangement as the over-optics 410 of the multi-LED over-optic 700. The multi-LED over-optic 700 includes the same or similar components as the multi-LED over-optic 400 illustrated in FIGS. 4-5 and described above. In particular, the multi-LED over-optic 700 includes ribs 415, mounting holes 420, posts 425, and one or more recessed linear pockets (not shown) disposed on a rear surface of the multi-LED over-optic 700.

FIG. 8 is a perspective view of light module 800 having a heat sink 805 and one or more configurable LED modules 850, in accordance with certain exemplary embodiments of the present invention. Referring to FIGS. 2, 4, and 8, the exemplary heat sink 805 includes a top surface 810 for mounting two configurable LED modules 850 thereto. Each LED module 850 includes a configurable LED substrate 200 and although not shown, can include a multi-LED over-optic, such as one of the multi-LED over-optics 400, 600, and 700 illustrated in FIGS. 4, 6, and 7, respectively. For ease of discussion, the remainder of the discussion of FIG. 8 refers to LED modules 850 having the configurable LED substrate 200 and the multi-LED over-optic 400 although one of the other exemplary multi-LED over-optics 600, 700 could be used in place of the multi-LED over-optic 400.

The heat sink 805 also includes a multitude of heat sink fins 815, a power feed aperture 820, mounting holes 825, and multiple slots 830. The heat sink 805 may be fabricated from aluminum, steel, or any other conductive material known to those of ordinary skill in the art having the benefit of this disclosure. In certain exemplary embodiments, the heat sink 805 is extruded.

The exemplary heat sink 805 is configured to dissipate approximately 80 watts of heat produced from each of the two configurable LED modules 850. This heat dissipation configuration includes configurable LED modules incorporating the thirty-six LED substrate 200 having approximately 350 mA of current, a twenty-four LED substrate having approximately 525 mA of current, or a sixteen LED substrate having approximately 700 mA of current. The heat sink 805 can be modified based on the total overall light module wattage, what the manufacturer wants a light fixture incorporating the light module 800 to look like, and the particular use of the light module 800. While the exemplary heat sink 805 is shown as being capable of receiving a pair of configurable LED modules 850, the exemplary heat sink 805 is easily modifiable to receive and hold one or more configurable LED modules 850 in 1 by X, X by X, or X by Y array configurations.

The heat sink fins 815 extend downwards from the top surface 810 and, in certain exemplary embodiments, extend along the longitudinal axis of the heat sink 805. Alternatively, the heat sink fins 815 traverse to the longitudinal axis of the heat sink 805. The slots 830 are cut into the top surface 810 of the heat sink 805 and also extend along the longitudinal axis of the heat sink 805. In certain exemplary embodiments, the slots 830 are created during the same extrusion process that creates the heat sink 805. Alternatively, the slots 830 are machined into the top surface 810 using known methods. While the exemplary slots 830 are shown extending along the longitudinal axis, the slots 830 could alternatively extend latitudinally and/or traverse to the direction of extension for the heat sink fins 815. The power feed apertures 820 (only one shown in FIG. 8) are typically a through-hole configured to align with the aperture 110 of the configurable LED substrate

200. The power feed apertures 820 provide a pathway for electrical wiring to pass through the heat sink 805 and be coupled to the configurable LED substrates 200 of the configurable LED modules 850. For example, power wiring can be routed from a power source, through one of the power feed apertures 820 and through the aperture 110 of the LED substrate 200 to connect to the leads 115, 120 of the LED substrate 200.

The mounting holes 825 are typically cut into the top surface 810 of the heat sink 805 and provide an engagement point for mounting posts 425 of a multi-LED over-optic 400. In an alternative embodiment, the mounting posts 425 could be formed as part of or directly coupled to the configurable LED substrate 200 instead of the multi-LED over-optic 400 and the multi-LED over-optic 400 can be separately coupled to the LED substrate 200. In one embodiment, the mounting holes 825 are cut to a depth of about 0.090 inches. While the exemplary embodiment of FIG. 8 shows four mounting holes 825, in alternative embodiments where rotation of the configurable LED module 850 is not needed or desired, two or fewer mounting holes 825 may be used.

The mounting holes 825 of the heat sink 805 and the mounting posts 425 of the multi-LED over-optic 400 (or configurable LED substrate 200), provide a means for aligning the configurable LED modules 850 with the heat sink 805. In one example, positioning the mounting posts 425 into the mounting holes 825 automatically aligns the configurable LED modules 850 with the heat sink 805 so that the holes 215, 420 in the configurable LED substrate 200 and the multi-LED over-optic 400 line up with the slots 830 of the heat sink 805. Self-tapping screws may be positioned through the holes 215, 420 and into the slots 830 of the heat sink 805 to couple the configurable LED module 850 to the heat sink 805.

In certain exemplary embodiments, when four mounting holes 825 are incorporated into the heat sink 805 for each configurable LED module 850, only two of the four holes 825 may be used at a time. However, if a user desires to rotate the configurable LED module 850 to change the orientation of all of the over-optics 410 at one time, the configurable LED module 850 (or the multi-LED over-optic 400 only) can be lifted off of the surface 810 of the heat sink 805, rotated in one or more 90 degree steps, and placed back down on the surface 810 of the heat sink 805 and the mounting posts 425 will still engage a pair of the mounting holes 825 while continuing to align the holes 215, 420 with the slots 830 and to align the power feed aperture 820 of the heat sink 805 with the aperture 110 of the configurable LED substrate 200. Such adjustability provides a user with an easy adjustment mechanism for all of the over-optics 410 simultaneously to affect the positioning of the light being distributed from the configurable LED module 850.

Figure 9A:
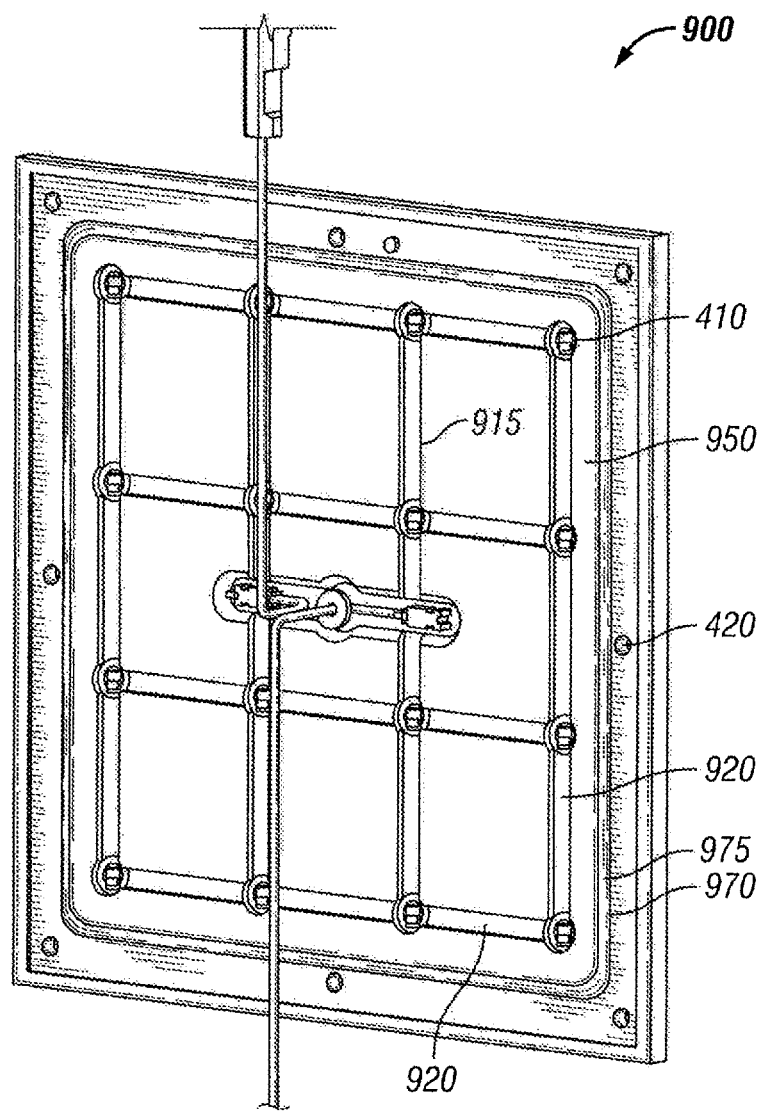
FIG. 9A is a perspective view of a bottom side of a multi-LED over-optic, in accordance with certain exemplary embodiments of the present invention.
Figure 9B:
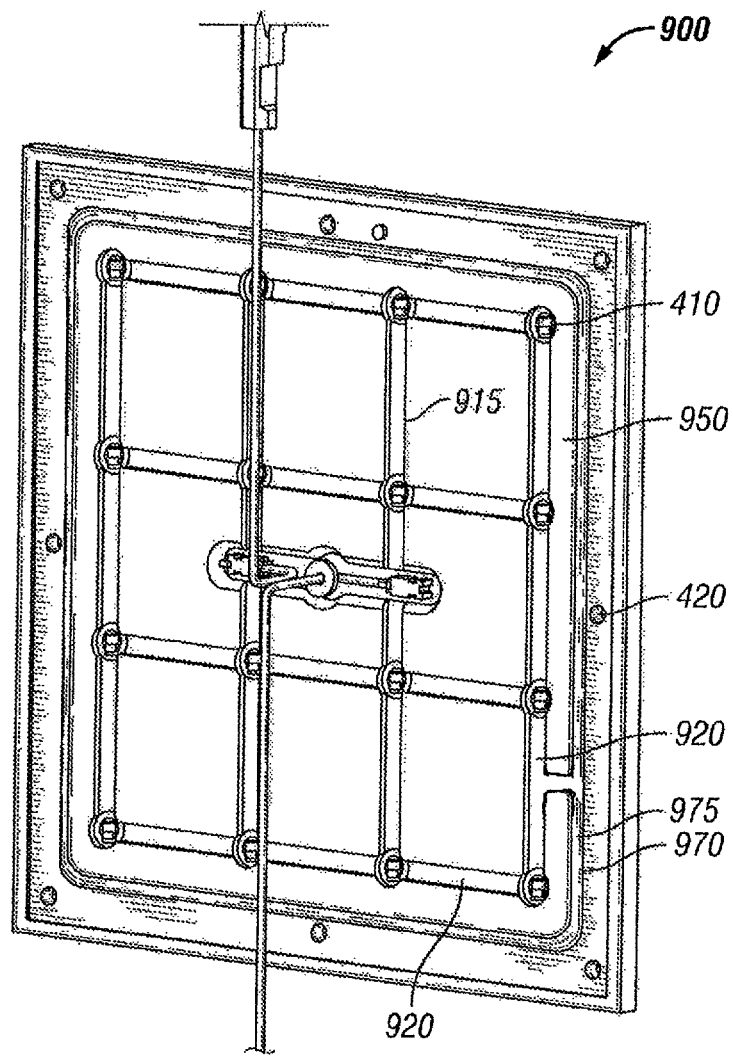
FIG. 9B is a perspective view of a bottom side of a multi-LED over-optic, in accordance with another exemplary embodiment of the present invention.

FIGS. 9A and 9B are perspective views of a multi-LED over-optic 900, in accordance with certain exemplary embodiments of the present invention. In particular, FIGS. 9A and 9B present perspective views of a bottom surface 950 of the multi-LED over-optic 900. Referring to FIGS. 9A and 9B, the exemplary multi-LED over-optic 900 includes many of the same or similar components as the multi-LED over-optic 400 illustrated in FIG. 4 and described above. For example, the multi-LED over-optic 900 includes a multitude of over-optics 410 and a multitude of mounting holes 420. However, the exemplary multi-LED over-optic 900 also includes interconnecting channels 920 etched into the rear surface 950. The channels 920 intersect each of the over-optics 410 and provide an internal volume for dissipating heat generated by LEDs disposed under the over-optics 410. This internal volume reduces the susceptibility of the LEDs to browning, burning out, or otherwise failing. In certain alternative embodiments, the channels 920 may not intersect. In one example, the channels 920 are arranged as rows extending in one direction only, rather than interconnecting.

The multi-LED over-optic 900 also includes a gasket 970 disposed in a gasket groove 975 of the rear surface 950. The gasket 970 may be fabricated from silicone and forms a seal with a configurable LED substrate, such as the configurable LED substrate 200. In certain exemplary embodiments, the gasket 970 is made of a material permeable to gases emanated by the LEDs 230 to expel the gases emanated by the LEDs 230 while also preventing liquids and other materials from entering the area between the multi-LED over-optic 900 and the configurable LED substrate 200. In certain exemplary embodiments, as illustrated in FIG. 9B, one or more of the channels 920 intersect the gasket groove 975 to vent the channels 920 and thus, the heat generated by the LEDs. Each of the exemplary multi-LED over-optics 400, 600, 700 discussed above also can incorporate the channels 920, gasket, 970, and gasket groove 975 features of the multi-LED over-optic 900.

Figure 10:
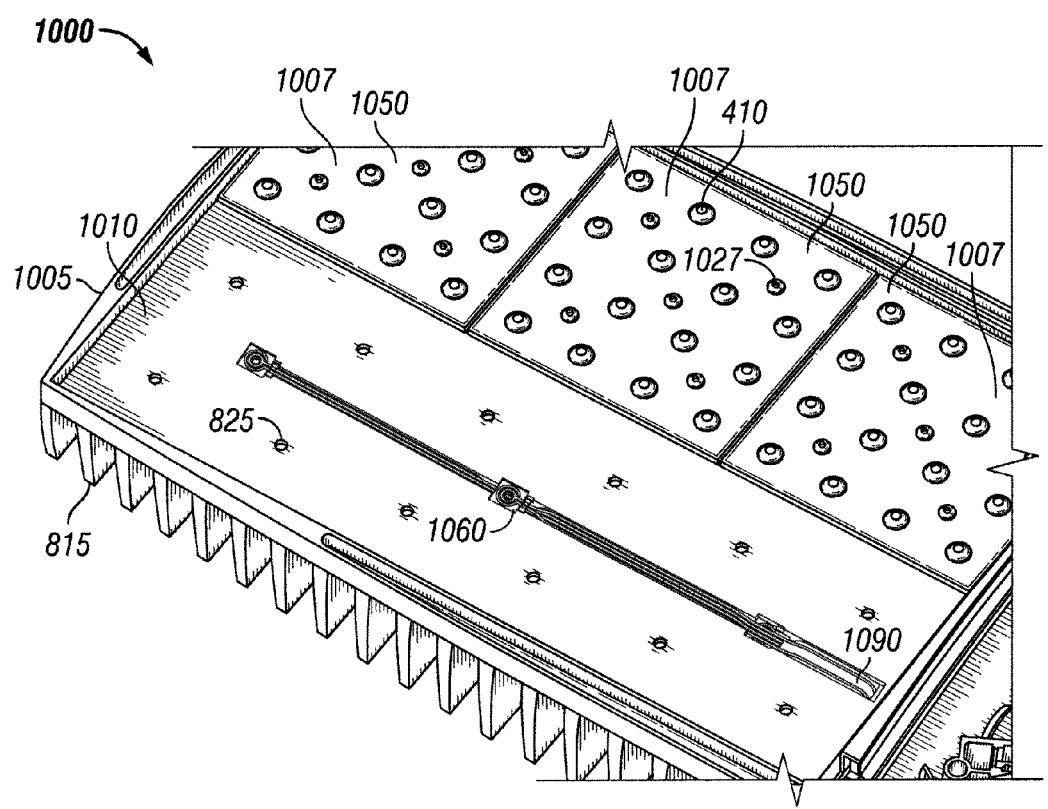
FIG. 10 is a perspective view of a light module, in accordance with certain exemplary embodiments of the present invention.

FIGS. 10-27 illustrate a multitude of mechanisms for connecting light modules, such as light modules incorporating the configurable LED substrate 200, to a power source. FIG. 10 illustrates a light module 1000, in accordance with certain exemplary embodiments of the present invention. Referring to FIG. 10, the exemplary light module 1000 includes a heat sink 1005 having a top surface 1010 for mounting six configurable LED modules 1050 thereto. However, the heat sink 1005 is easily modifiable to hold one or more configurable LED modules 1050 in 1 by X, X by X, or X by Y array configurations.

In the embodiment of FIG. 10, the configurable LED modules 1050 include a configurable LED substrate (not visible in FIG. 10) and a multi-LED over-optic 1007. The configurable LED substrate and multi-LED over optic 1007 of the configurable LED modules 1050 are configured to hold up to sixteen LEDs in a symmetrical arrangement. Thus, the configurable LED substrate of the configurable LED modules 1050 include sixteen LED coupling points and the multi-LED over-optic 1007 of the configurable LED modules 1050 includes sixteen discrete over-optics 410 arranged in a matching configuration as the LED coupling points of the configurable LED substrate 1050. For example, the configurable LED substrate of the of the configurable LED modules 1050 may be formed by populating the configurable LED substrate 200 of FIG. 2 with sixteen LEDs.

The heat sink 1005 also includes heat sink fins 815 that extend downwards from the top surface 1010. Similar to the heat sink 805 of FIG. 8, the heat sink fins 815 of the heat sink 1005 can extend along the longitudinal axis of the heat sink 1005 or traverse to the longitudinal axis of the heat sink 1005. The top surface 1010 of the heat sink 1005 includes mounting holes 825 that provide an engagement point for mounting posts 425 of the configurable LED modules 1050. Although not shown in FIG. 10, the top surface 1010 also can include slots similar to the slots 830 of the heat sink 805 illustrated in FIG. 8.

The top surface 1010 of the heat sink 1005 also includes channels 1090 (only one shown in FIG. 10) that extend along the longitudinal axis of the top surface 1010. Alternatively, the channels 1090 extend along the latitudinal axis of the top surface 1010. Regardless of the direction of extension, each channel 1090 is positioned to traverse the center of one or more configurable LED modules 1050 coupled to the top surface 1010. The channels 1090 route power wires 1080, 1085 from a power source to one or more concentric ring conductors 1060 disposed in the channel 1090 and positioned at the center of one of the configurable LED modules 1050.

Figure 11:
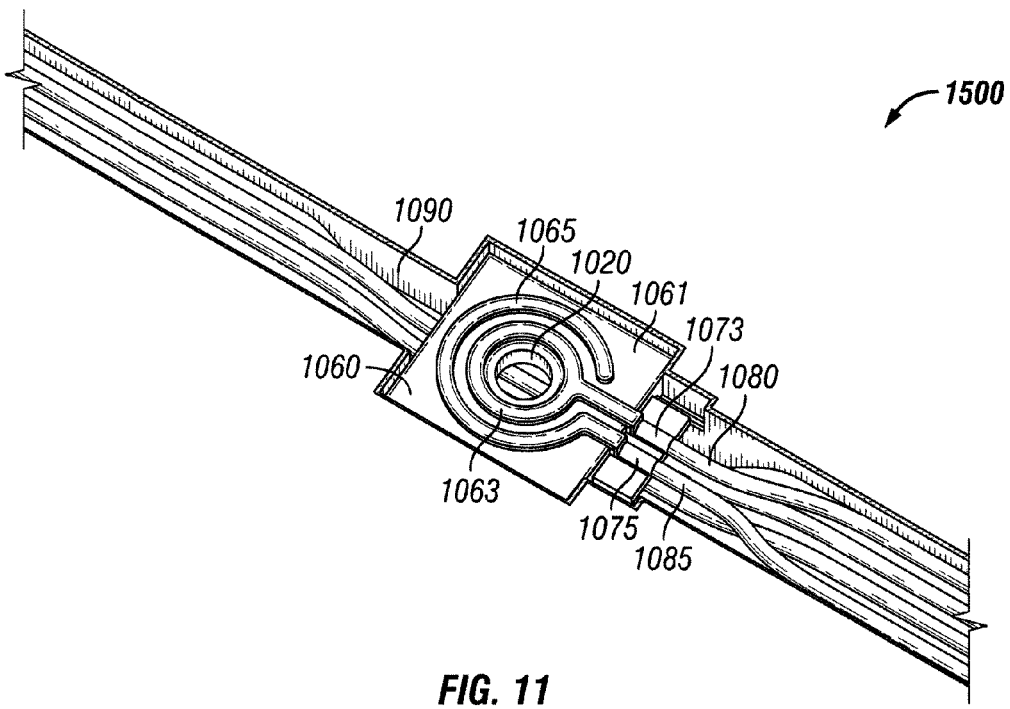
FIG. 11 is a perspective view of a portion of the light module of FIG. 10, in accordance with certain exemplary embodiments of the present invention.

As best seen in FIG. 11, which illustrates a portion of one of the channels 1090 and one of the concentric ring conductors 1060, the concentric ring conductors 1060 include two concentric rings of conductive material 1063, 1065 disposed on a non-conductive pad 1061. Each concentric ring 1063, 1065 is electrically coupled to one of the power wires 1080, 1085 to provide power to one of the configurable LED modules 1050 positioned above the concentric ring conductor 1060. In particular, the concentric ring 1063 is electrically coupled to the power wire 1080 via a connector 1073 and the concentric ring 1065 is electrically coupled to the power wire 1085 via a connector 1075. The power wires 1080, 1085 are coupled to opposite polarity terminals of the power source such that the polarity of the concentric rings 1063, 1065 is also opposite.

Each of the configurable LED modules 1050 include two electrically conductive pads disposed on the bottom side of the configurable substrate for making electrical contact with the concentric rings 1063, 1065 and thus, for receiving electrical power for the configurable LED modules 1050. The pads are configured such that a first of the pads contacts the concentric ring 1063 of one of the concentric ring conductors 1060 and the second of the pads contact the concentric ring 1065 of the concentric ring conductor 1060 when the configurable LED module 1050 is coupled to the heat sink 1005 above the concentric ring conductor 1060. The pads also are electrically coupled to the electrical traces of the configurable substrate of the configurable LED module 1050 to couple the electrical traces to the power source via the pads, the concentric ring conductor 1060, and the power wires 1080, 1085.

The concentric ring conductors 1060 are positioned depthwise in the channels 190 such that the concentric rings 1063, 1065 make good electrical contact with the pad of the configurable LED substrate when the configurable LED module 1050 is properly coupled to the top surface 1010 of the heat sink 1005. The concentric ring conductors 1060 include an aperture 1020 for receiving a coupling device 1027, such as a clamping screw or rivet. The coupling device 1027 protrudes through a mounting hole 420 located at the center of the configurable LED module 1050 and engages the aperture 1020 to hold the configurable LED module 1050 with the heat sink 1005. The concentric ring conductors 1060 are configured with concentric rings 1063, 1065 to allow the configurable LED modules 1050 to rotate about their centers while maintaining proper electrical contact with the concentric rings 1062, 1065. That is, the pads of each configurable LED module 1050 rotate along with the configurable LED module 1050 such that each pad maintains contact with its respective concentric ring 1063, 1065.

The channels 1090 are configured such that there is space below the concentric ring conductors 1060 for routing power wires disposed in the channel 1090. In certain alternative embodiments, a circuit board having electrical traces is used in place of the electrical wires. In one example, a long, narrow circuit board having electrical traces is routed through the channels 1090. The concentric rings 1063, 1065 can be an integral part of such a circuit board, for example disposed on an upper surface of the circuit board. The electrical traces are electrically coupled to the power source, for example via electrical wires, and are further electrically coupled to the concentric rings 1063, 1065.

Figure 12:
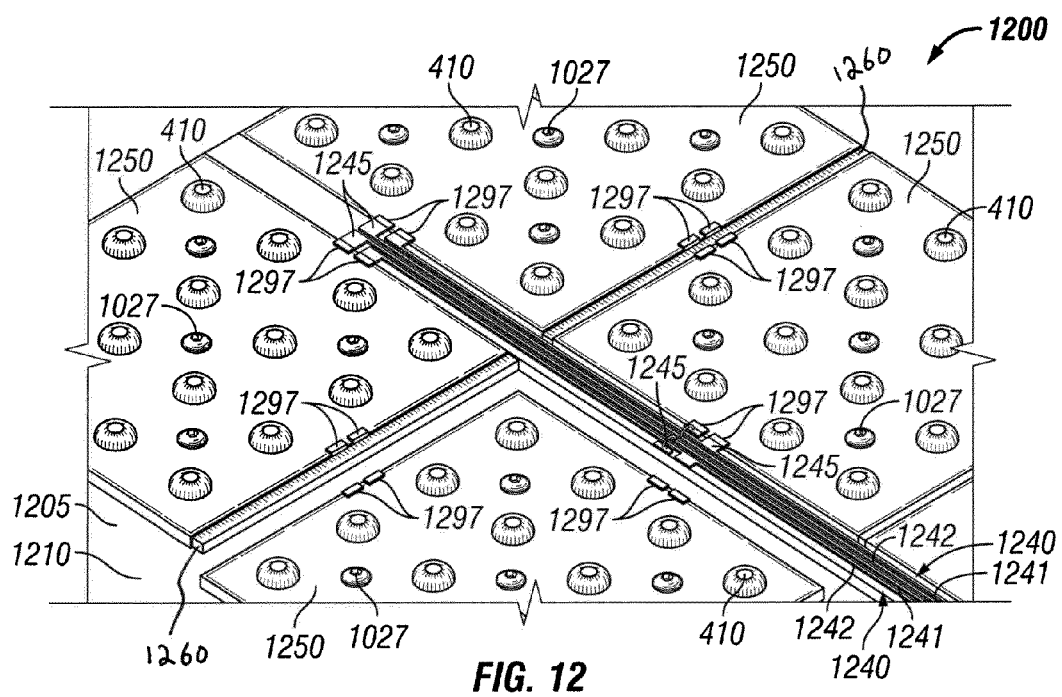
FIG. 12 is a perspective view of a portion of a light module, in accordance with certain exemplary embodiments of the present invention.

FIG. 12 depicts a portion of a light module 1200, in accordance with certain exemplary embodiments of the present invention. Referring to FIG. 12, the exemplary light module 1200 includes four configurable LED modules 1250 disposed on a top surface 1210 of a heat sink 1205. The heat sink 1205, similar to the heat sinks 805 and 1005 illustrated in FIGS. 8 and 10, respectively, is easily modifiable to hold one or more configurable LED modules 1250 in 1 by X, X by X, or X by Y array configurations. The heat sink 1205 also can include similar features as the heat sinks 805 and 1005.

The light module 1200 also includes one or more bus bars 1240 that route electrical power to the configurable LED modules 1250. Each bus bar 1240 includes two conductors 1241, 1242 that are electrically coupled to opposite polarities of a power source (not shown). In one example, the conductor 1241 is electrically coupled to a negative polarity terminal of the power source and the conductor 1242 is connected to a positive polarity terminal of the power source. The bus bars 1240 are mounted on an insulation bar 1260, which is mounted on the top surface 1210. The insulator bar 1260 insulates the heat sink 1205 from current flowing on the conductors 1241, 1242. The insulator bar 1260 and the bus bar 1260 are positioned between pairs of configurable LED modules 1250 and can extend along the length of the top surface 1210 to route power to any number of configurable LED modules 1250.

The conductors 1241, 1242 of the bus bars 1240 include at least one pair of electrical contacts 1245 for electrically coupling the conductors 1241, 1242 to the configurable LED modules 1250. The configurable LED modules 1250, which can be substantially the same as the LED module 1050 of FIG. 10, also include at least one pair of electrical contacts 1297. The contacts 1297 are disposed on at least one side of the configurable LED modules 1250 and are configured to make contact with a corresponding pair of contacts 1245 of one of the bus bars 1240.

As shown in FIG. 12, the configurable LED modules 1250 can include a pair of contacts 1297 on multiple (or all) sides of the configurable LED module 1250. This configuration allows the configurable LED modules 1250 to be rotated in one or more 90 degree increments about its center and retain an electrical connection to the bus bar 1240. To prevent electrical contact between pairs of contacts 1297 of adjacent configurable LED modules 1250, an insulator bar 1265 is disposed between each pair of adjacent configurable LED modules 1250.

Figure 13:
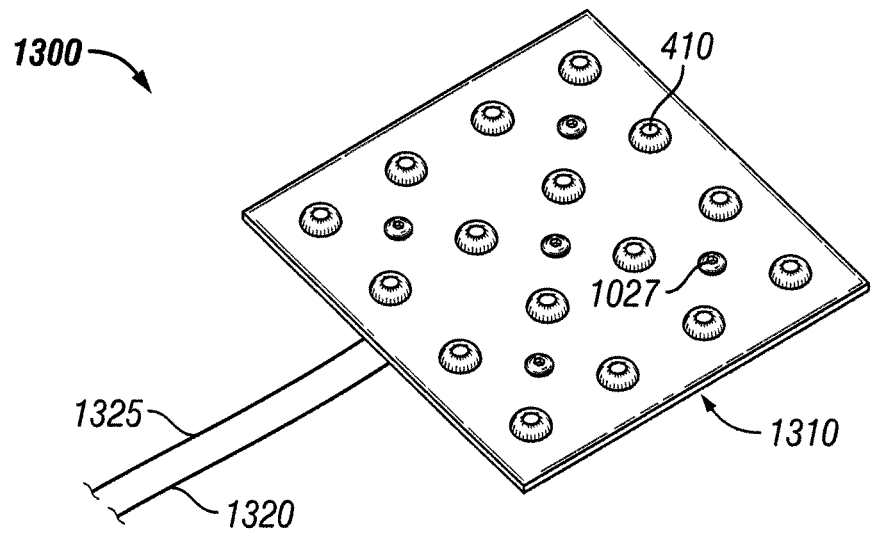
FIG. 13 is a perspective view of a configurable LED module, in accordance with certain exemplary embodiments of the present invention.
Figure 14:
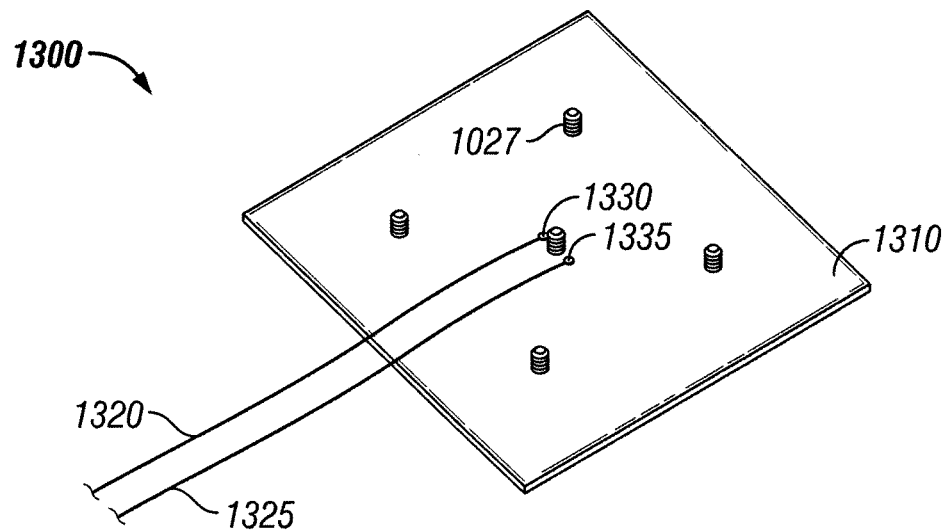
FIG. 14 is a perspective view of a bottom side of the configurable LED module of FIG. 13, in accordance with certain exemplary embodiments of the present invention.

FIGS. 13 and 14 depict a configurable LED module 1300 having an alternative means for receiving power, in accordance with certain exemplary embodiments of the present invention. Referring to FIGS. 13 and 14, the configurable LED module 1300 is substantially the same as the configurable LED module 1050 of FIG. 10. However, the exemplary configurable LED module 1300 receives power via two wires 1320, 1325 that are connected at one end to a power source (not shown) and connected at the other end to the configurable LED substrate 1310 of the configurable LED module 1300. In one example, one end of each wire 1320, 1325 may be soldered to a respective conductive pad 1330, 1335 of the configurable LED substrate 1310. The conductive pads 1330, 1335 are electrically coupled to the electrical traces of the configurable LED substrate 1310 to route power received via the wires 1320, 1325 to the LED coupling points, and ultimately to LEDs coupled to the LED coupling points. The wires 1320, 1325 are configurable and flex into place when the configurable LED module 1300 is rotated about its center, for example when rotated with respect to a heat sink that the LED module 1300 is coupled to.

Figure 15:
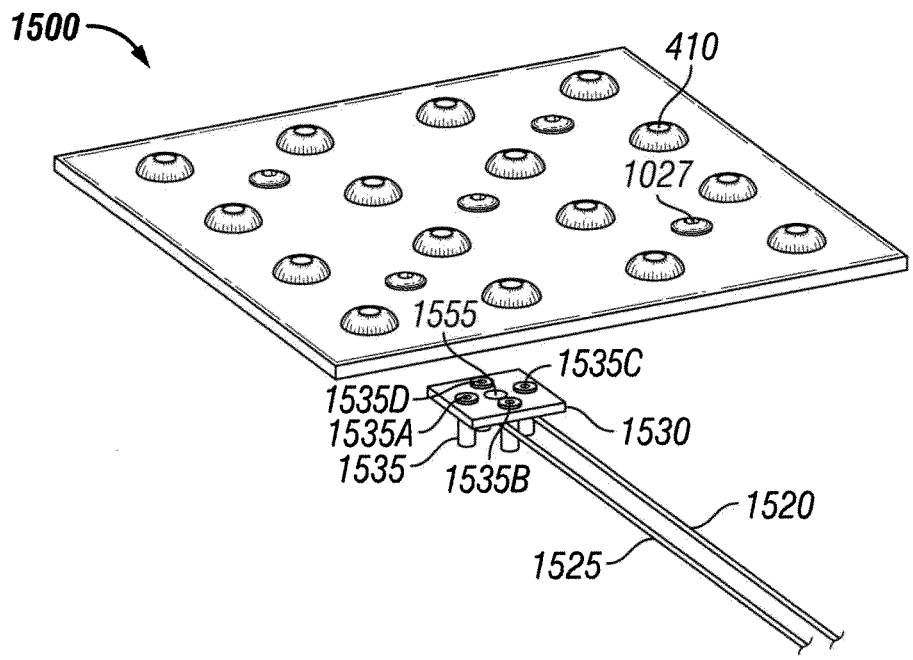
FIG. 15 is a perspective view of a configurable LED module, in accordance with certain exemplary embodiments of the present invention.
Figure 16:
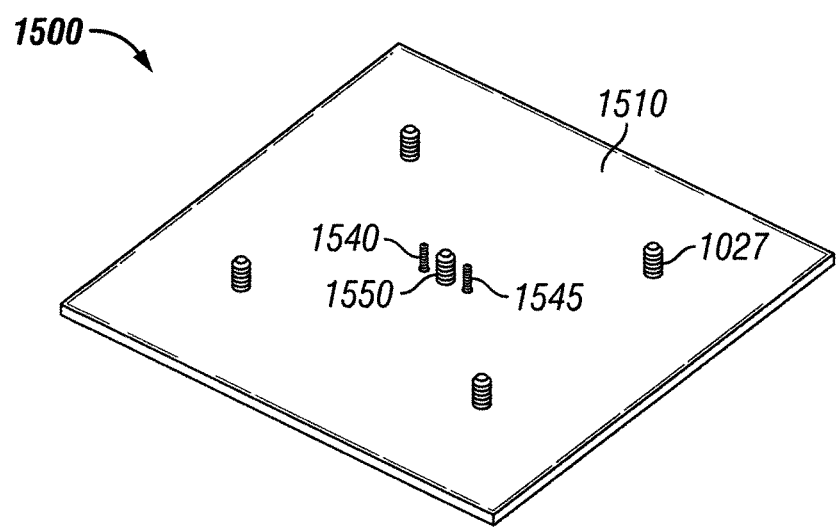
FIG. 16 is a perspective view of a bottom side of the configurable LED module of FIG. 15, in accordance with certain exemplary embodiments of the present invention.
Figure 17:
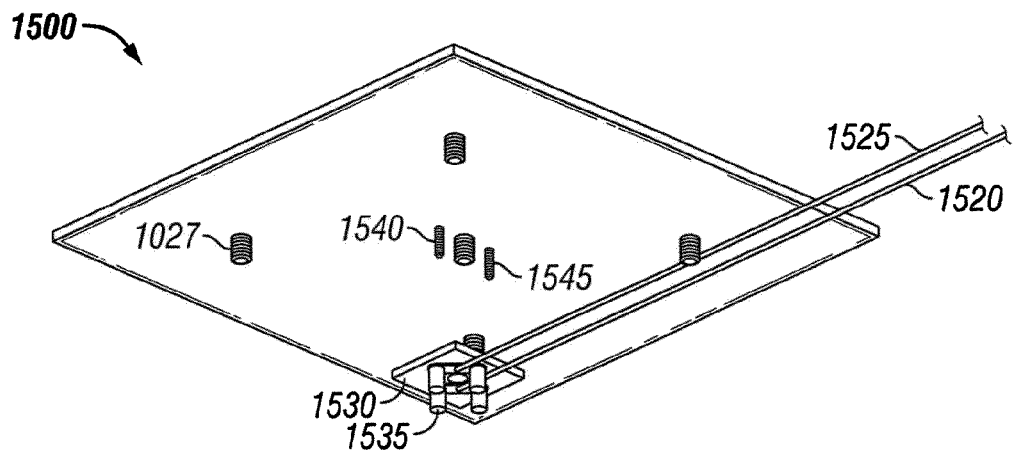
FIG. 17 is another perspective view of the bottom side of the configurable LED module of FIG. 15, in accordance with certain exemplary embodiments of the present invention.

FIGS. 15-17 depict a configurable LED module 1500 having an alternative means for receiving power, in accordance with certain exemplary embodiments of the present invention. Referring to FIGS. 15-17, the configurable LED module 1500 is substantially the same as the configurable LED module 1050 of FIG. 10. However, the exemplary configurable LED module 1500 includes two electrical pins 1540, 1545 and a mounting post 1550 that each extend from a bottom surface 1510 of the configurable LED module 1500. The mounting post 1550 is configured to engage a mounting aperture 1555 of an electrical connector 1530 to hold the electrical connector 1530 with the configurable LED module 1500.

The electrical connector 1530 includes four electrical receptacles 1535 that are configured to engage the electrical pins 1535 of the configurable LED module 1500. The electrical receptacles 1535 also are connected to a power source (not shown) via power wires 1520, 1525. In certain exemplary embodiments, the electrical connector 1530 is configured such that electrical receptacles 1535 disposed on opposite sides of the electrical connector 1530 have opposite polarizations. That is, two of the receptacles 1535 are attached to the power wire 1520 and the other two receptacles 1535 are electrically coupled to the power wire 1525 such that receptacles 1535 opposite one another have opposite polarizations. In one example, receptacles 1535A and 1535B are electrically coupled to the power wire 1525 while receptacles 1535C and 1535D are electrically coupled to the power wire 1520. Further, the power wire 1520 is electrically coupled to one polarity terminal of the power source, for example the positive terminal, while the power wire 1525 is electrically coupled to the opposite polarity terminal of the power source.

The electrical pins 1540, 1545 are electrically coupled to the electrical traces of the configurable LED substrate of the configurable LED module 1500. The electrical pins 1540, 1545 are configured such that one of the electrical pins 1540 engages one of the receptacles 1535 to electrically couple to one polarity of the power source and the other electrical pin 1545 engages another of the receptacles 1535 to electrically couple to an opposite polarity of the power source. In the exemplary embodiment of FIGS. 15-17, the electrical pins 1540, 1545 are disposed on opposite sides of the mounting post 1550 to engage receptacles 1535 disposed opposite from one another. In this configuration, the configurable LED module 1500 is capable of being removed from the electrical connector 1530 and rotated in 90 degree steps while maintaining opposite polarities on the electrical pins 1540, 1545.

In certain exemplary embodiments, the electrical connector 1530 is attached to another object, such as a heat sink. In one example, a multitude of electrical connectors 1530 are disposed on a heat sink surface having a channel for routing power wires 1520, 1520 to each of the electrical connectors 1530. A configurable LED module 1500 can be coupled to the electrical connectors 1530 and rotated to provide a desired light output.

Figure 18:
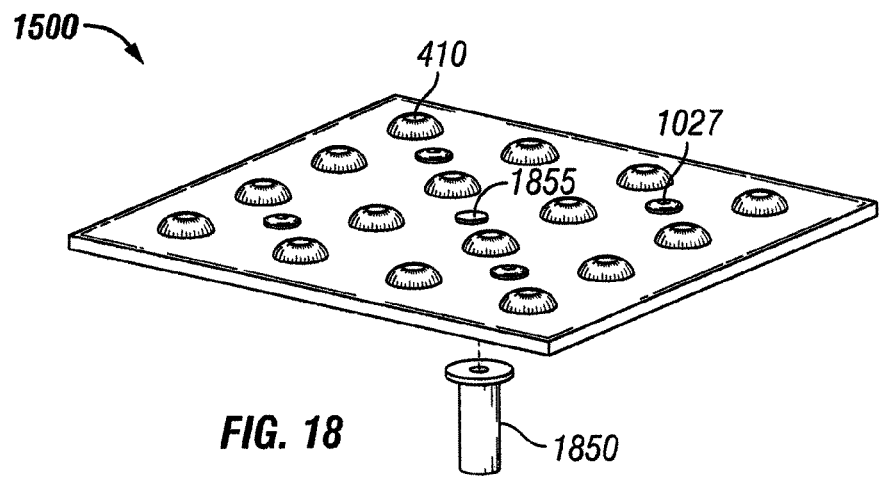
FIG. 18 is a perspective view of a configurable LED module, in accordance with certain exemplary embodiments of the present invention.
Figure 19:
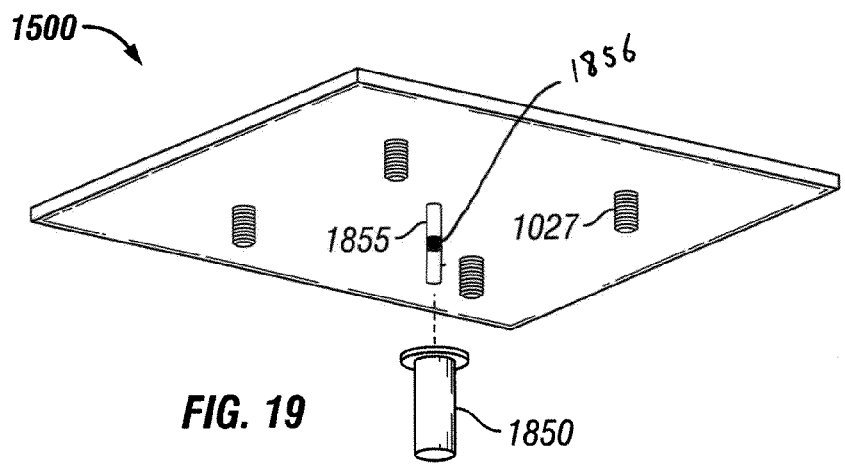
FIG. 19 is a perspective view of a bottom side of the configurable LED module of FIG. 18, in accordance with certain exemplary embodiments of the present invention.

FIGS. 18 and 19 depict a configurable LED module 1800 having an alternative means for receiving power, in accordance with certain exemplary embodiments of the present invention. Referring to FIGS. 18 and 19, the configurable LED module 1800 is substantially the same as the LED module 1050 of FIG. 10. However, the exemplary configurable LED module 1800 includes an electrical pin 1855, embodied as a TRS (tip, ring, sleeve) connector, that engages a socket 1850. Both the pin 1855 and the socket 1850 are divided electrically along their lengths such that the pin 1855 and socket 1850 have multiple circuits. This system is similar to existing audio headphone jack systems. For example, an upper portion of the shaft of the pin 1855 and an upper portion of the socket 1850 may create a first circuit when the pin 1855 engages the socket 1850 and a lower portion of the shaft of the pin 1855 and a lower portion of the socket 1850 may create a second circuit when the pin 1855 engages the socket 1850. An insulated portion 1856 of the pin 1855 electrically isolates the upper portion of the shaft of the pin 1855 from the lower portion of the shaft of the pin 1855.

To supply power to the configurable LED module 1800, the upper portion of the socket 1850 is electrically coupled to one polarity of the power source and the lower portion of the socket 1850 is electrically coupled to the opposite polarity of the power source. The upper and lower portions of the shaft of the pin 1855 can be electrically coupled to electrical traces incorporated into a configurable LED substrate of the configurable LED module 1800 to route the power from the power source to LEDs mounted on the configurable LED substrate. In this configuration, the configurable LED module 1800 can be rotated about the pin 1855 at any increment, including 90 degree increments, while maintaining opposite polarities on the upper and lower portions of the shaft of the pin 1855.

In certain exemplary embodiments, the pin 1855 is soldered to the substrate of the LED module 1800 such that a first terminal, such as a positive terminal, is electrically coupled to an electrical trace of the substrate and a second terminal, such as a negative terminal, is electrically coupled to an electrical trace of the substrate. For example, the first terminal may be soldered to a conductive pad that is electrically coupled to an electrical trace. Similarly, the second terminal may be soldered to a conductive pad that is electrically coupled to another electrical trace. In this configuration, electrical leads or jumpers are not required to make an electrical connection between the pin 1855 and the electrical traces.

In certain alternative embodiments, the pin 1855 is electrically coupled to the power source and the socket 1850 is disposed on the LED module 1800 and electrically connected to the electrical traces of the substrate. In certain exemplary embodiments, a barrel connector, such as those used to power laptop computer, and corresponding socket are used in place of the pin 1855 and socket 1850, respectively.

Figure 20:
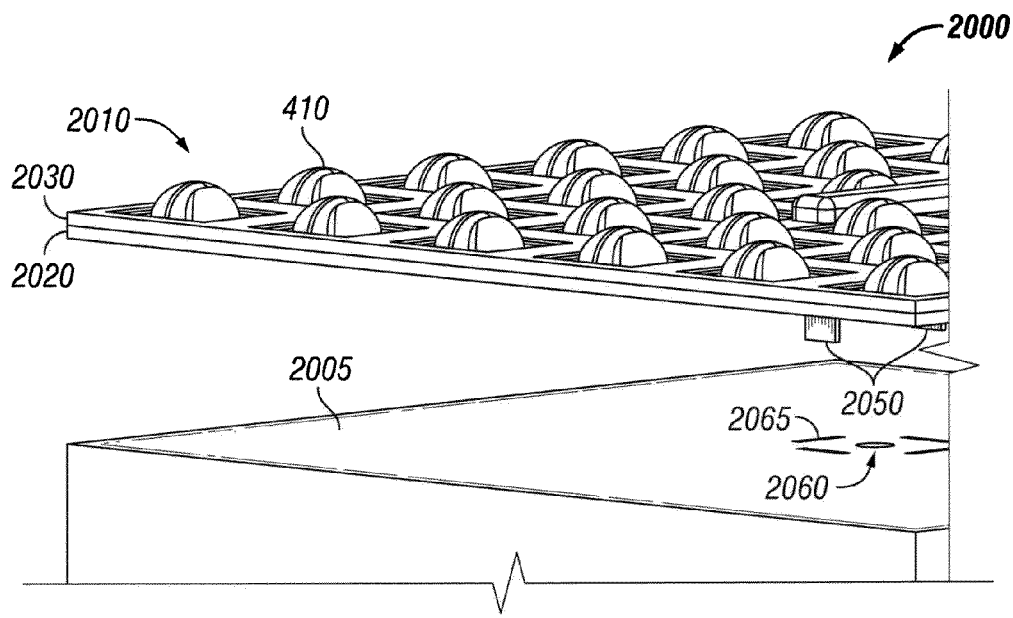
FIG. 20 is a perspective view of a portion of a light module, in accordance with certain exemplary embodiments of the present invention.

FIG. 20 is a perspective view of a portion of a light module 2000, in accordance with certain exemplary embodiments of the present invention. The exemplary light module 2000 includes a mounting surface 2005, such as a surface of a heat sink, having an electrical receptacle 2060 embedded therein. The electrical receptacle 2060 includes four receptacle slots 2065 that are each electrically coupled to a power source. Similar to the arrangement of the electrical connector 1530 of FIGS. 15-17, the receptacle slots 2065 are configured such that receptacle slots 2065 opposite one another are connected to opposite polarities of the power supply.

The light module 2000 also includes one or more configurable LED modules 2010 for mounting on the mounting surface 2005. The configurable LED modules 2010 include a configurable LED substrate 2020, which can be the same as the configurable LED substrate 200, and a multi-LED over-optic 2030. The configurable LED module 2010 also includes two prongs 2050 for engaging the receptacle slots 2060 to receive power for LEDs coupled to the configurable LED substrate 2010. The prongs 2050 are configured such that the prongs 2050 engage receptacles 2060 connected to opposite polarities of the power supply. That is, the prongs 2050 are configured such that the prongs 2050 engage receptacles disposed on opposite sides from one another. In this configuration, the configurable LED module 2010 can be lifted from the mounting surface 2005, rotated in one or more 90 degree steps, and returned to the mounting surface 2005 such that the prongs 2050 reconnect to opposite polarities of the power supply. A similar electrical connection mechanism is described in further detail below with reference to FIGS. 23-26.

Figure 22:
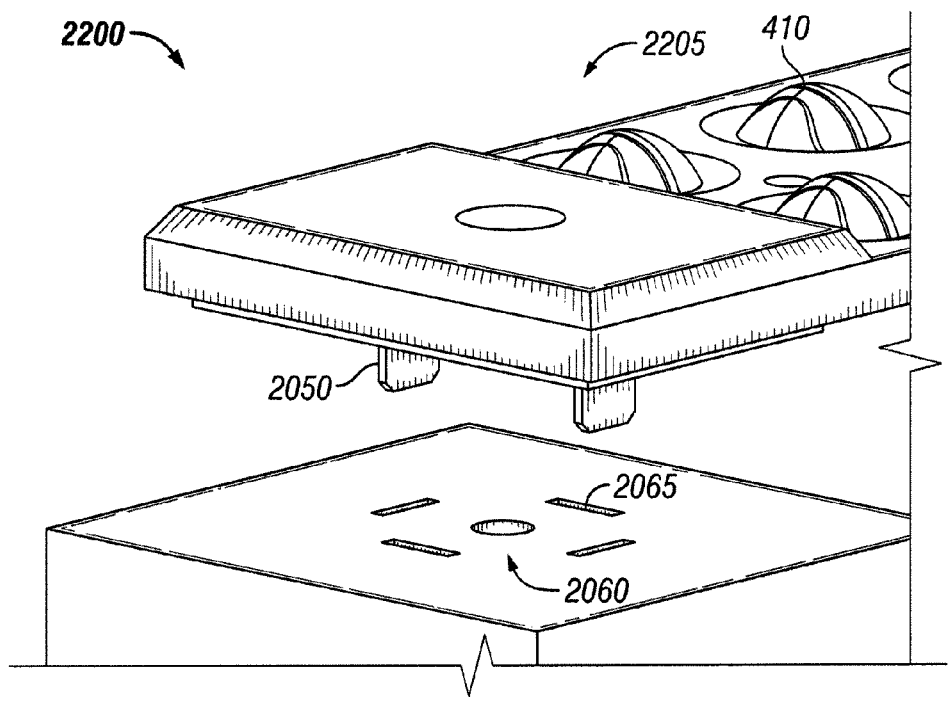
FIG. 22 is a perspective view of a portion of a light module, in accordance with certain exemplary embodiments of the present invention.

FIG. 22 is a perspective view of a portion of an alternative light module 2200, in accordance with certain exemplary embodiments of the present invention. Referring to FIG. 22, the exemplary light module 2200 is similar to the light module 2000 illustrated in FIG. 20. However, the light module 2200 includes prongs 2050 disposed on a side of a configurable LED module 2205 rather than at the center of the LED module 2205.

Figure 21:
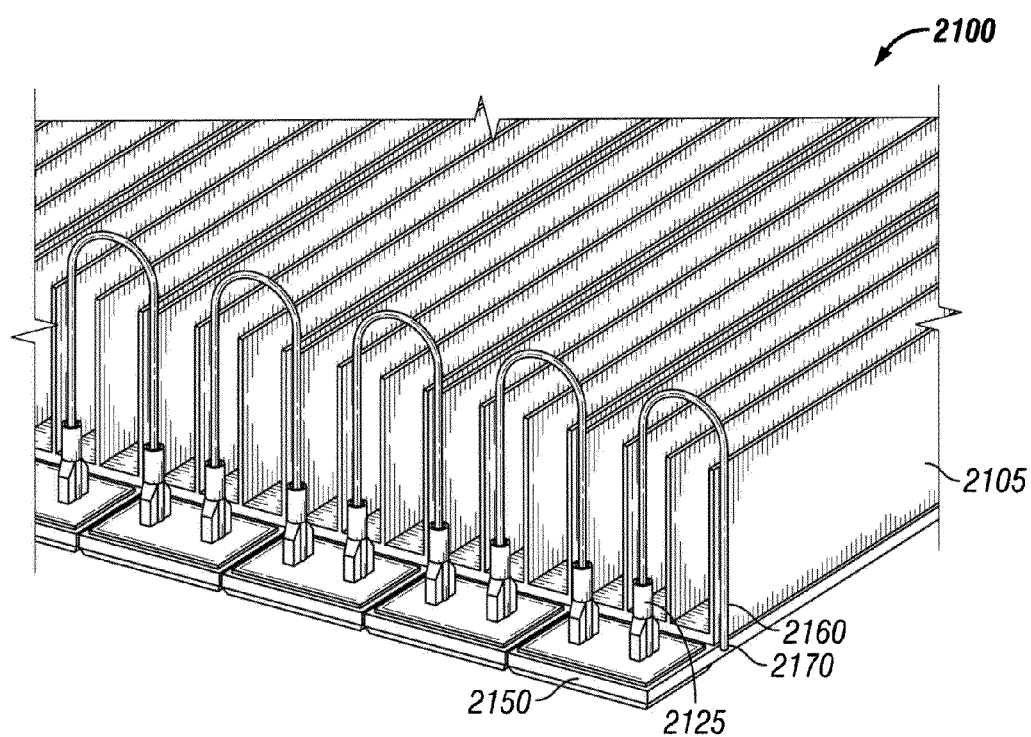
FIG. 21 is a perspective view of a portion of a light module, in accordance with certain exemplary embodiments of the present invention.

FIG. 21 is a perspective view of a portion of a light module 2100, in accordance with certain exemplary embodiments of the present invention. Referring to FIG. 21, the exemplary light module 2100 includes a heat sink 2105 and a multitude of configurable LED modules 2150 coupled thereto. In this exemplary embodiment, the configurable LED modules 2150 are jumpered together via cables 2160 and connectors 2125 disposed on a bottom surface of the configurable LED modules 2150. One cable 2170 is coupled to a power source to provide power to the configurable LED modules 2150.

Figure 23:
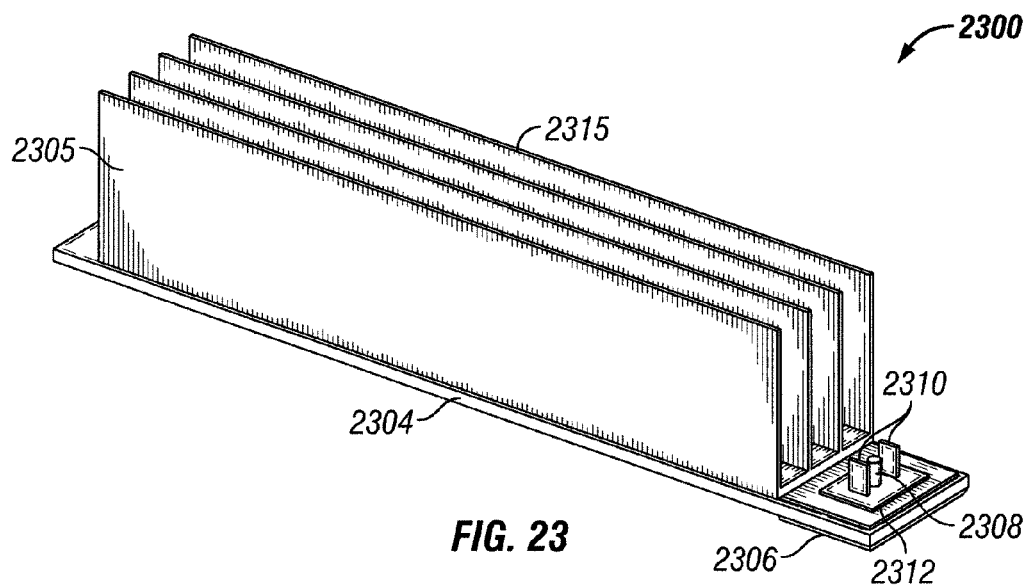
FIG. 23 is a perspective view of a light bar having a power connection means, in accordance with certain exemplary embodiments of the present invention.

FIG. 23-26 illustrate a light bar 2300, in accordance with certain exemplary embodiments of the present invention. In particular. FIGS. 23-24 present perspective view of the light bar 2300; FIG. 25 illustrates a cross-sectional view of a power connection means for the light bar 2300; and FIG. 26 illustrates the connection between a connector plug 2310 and a PCB 2314. Referring to FIGS. 23-26, the exemplary light bar 2300 includes a heat sink 2305 having a multitude of heat sink fins 2315 and a cover 2304. The light bar 2300 also includes two power connector plugs 2310 disposed at one end of the light bar 2300. In one embodiment, the connector plugs 2310 are connected to the light bar 2300 via at least a pressure from a back plate 2306 being fastened to the light bar 2300 by a fastener 2308, such as a screw or rivet. In certain exemplary embodiments, the fastener 2308 mechanically holds the light bar 2300 to a fixture housing while also ensuring an adequate connected between the connector plugs 2310 and their corresponding sockets (not shown). In certain exemplary embodiments, the connector plugs 2310 are connected, not just by the pressure applied via the fastener 2308 and plate 2306, but are also held in place by a die cut adhesive backed gasket 2312.

As best seen in FIG. 24, the light bar 2300 includes optics 2410, such as LEDs having an over-optic, through which light is emitted and controlled. In certain exemplary embodiments, each optic 2410 corresponds to at least one LED light engine. In certain exemplary embodiments, the optics 2410 are incorporated in a flex LED module similar to the flex LED modules discussed above.

As best seen in FIG. 25, the connector plugs 2310 are substantially L-shaped. The dies cut adhesive backed gasket 2312 is connected to a PCB 2316 of the light bar 2300 and shaped around the connector plugs 2310 and the fastener 2308. In certain alternative embodiments, the connector plugs 2310 may be of a different shape and connected directly to the PCB 2316, to the back plate 2306, or kept in place through pressure between the PCB 2316 and the back plate 2306 due to the engagement of the fastener 2308. The fastener 2308 connects the plate 2306 to the PCB 2316. In other alternative embodiments, the back plate 2306 is optional, with the fastener 2308 connecting the PCB 2316 to the gasket 2312. In some other alternative embodiments, the fastener 2308 also serves as a connector plug 2310.

As best seen in FIG. 26, the connector plugs 2310 may be soldered to the PCB 2314. In certain exemplary embodiments, the connector plugs 2310 are soldered to conductive pads (not shown) on the PCB 2314. The conductive pads also are connected to electrical traces of the PCB 2314 to route power from a power socket that the connector plugs 2310 engage to the optics 2410. Although not shown in detail in FIG. 20, the prongs 2050 of the light module 2000 may have a similar construction and attachment mechanism as the connector plugs 2310.

Figure 27:
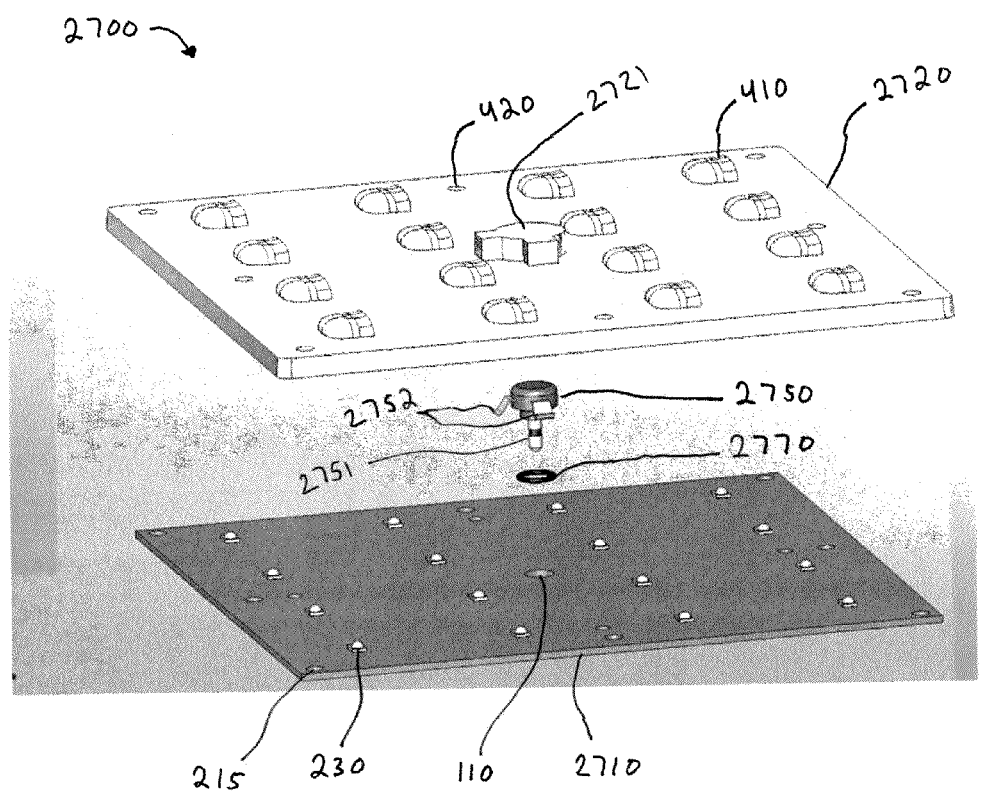
FIG. 27 is a perspective view of light module, in accordance with certain exemplary embodiments of the present invention.

FIG. 27 is a perspective view of light module 2700, in accordance with certain exemplary embodiments of the present invention. The exemplary light module 2700 includes a configurable LED substrate 2710 and a multi-LED over-optic 2720, similar to the configurable LED substrates and multi-LED over-optics described above. The light module 2700 also includes an electrical connector 2750 for routing electrical power from a power source to electrical traces of the configurable LED substrate 2710 and ultimately to the LEDs 230 coupled to the configurable LED substrate 2710. The exemplary electrical connector 2750 includes a TRS connector 2751 and two leaf spring contacts 2752. When the multi-LED over-optic 2720 is coupled to the configurable LED substrate 2710, for example via screws or rivets, the TRS connector 2751 protrudes through an aperture 110 in the configurable LED substrate 2710 and engages a socket (not shown) that is electrically coupled to a power source. Also, when the multi-LED over-optic 2720 is coupled to the configurable LED substrate 2710, the leaf spring contacts 2752 each contact a respective conductive pad disposed on the multi-LED over-optic 2720 is coupled to the configurable LED substrate 2710. Thus, the connector 2750 provides an electrical connection between the power source and the LEDS 2730 without the need for a solder connection. Instead, the force provided by the screws or rivets holding the when the multi-LED over-optic 2720 is coupled to the configurable LED substrate 2710 with the multi-LED over-optic 2720 ensures proper electrical contact between the pads of the configurable LED substrate 2710 and the leaf spring contacts 2752. An o-ring 2770 is compressed between the electrical connector 2750 and the configurable LED substrate 2710 when the multi-LED over-optic 2720 is coupled to the configurable LED substrate 2710.

A first portion of the TRS connector 2751 can be electrically coupled to a first polarity terminal of the power source and a second portion of the TRS connector 2751 can be electrically coupled to the opposite polarity terminal of the power source. The first portion of the TRS connector 2751 also can be electrically coupled to one of the leaf spring contacts 2752 while the second portion is electrically coupled to the other leaf spring contact 2752. In this manner, both polarities of the power source are connected to the electrical traces via the electrical connector 2750.

The multi-LED over-optic 2720 also includes a raised cavity 2721 for receiving a portion of the electrical connector 2750. Although the cavity 2721 is illustrated as having space for two leaf spring contacts 2752 only, in alternative embodiments, the cavity 2721 includes space for four leaf spring contacts 2752 such that there is space for a wing connector 2752 on each side of the cavity 2721. In this manner, the multi-LED over-optic 2720 can be rotated about its center relative to the configurable LED substrate 2710.

Although specific embodiments of the invention have been described above in detail, the description is merely for purposes of illustration. Various modifications of, and equivalent blocks corresponding to, the disclosed aspects of the exemplary embodiments, in addition to those described above, can be made by those having ordinary skill in the art without departing from the spirit and scope of the invention defined in the following claims, the scope of which is to be accorded the broadest interpretation so as to encompass such modifications and equivalent structures.

What is claimed is:

1. An illumination device, comprising:
    a substrate;
    at least one electrical trace disposed directly on the substrate;
    a plurality of LED coupling points formed directly on the at least one electrical trace, each LED coupling point electrically coupled to the electrical trace; and
    a multi-LED over-optic comprising a base surface and a plurality of discrete over-optics, wherein the base surface comprises one or more mounting elements between at least two of the discrete over-optics, the mounting elements being in contact with the substrate,
    wherein each of the plurality of discrete over-optics has a substantially concave shape defining a cavity, the cavity having a closed end defined by the discrete over-optic and an open end facing towards the substrate, the closed end of the cavity of the discrete over-optic extending from a top surface of the multi-LED over-optic in a direction away from the substrate, and wherein the open ends of two or more of the cavities are in fluid communication via an internal volume between the multi-LED over-optic and substrate.

2. The illumination device of claim 1, further comprising a plurality of LEDs electrically coupled to one or more of the LED coupling points, wherein each of the one or more discrete over-optic is configured to be positioned over one of the LEDs.

3. The illumination device of claim 1, wherein at least one of the LED coupling points comprises a jumper electrically coupling one of the at least one electrical trace to another of the at least one electrical trace.

4. The illumination device of claim 1, wherein the substrate comprises a plurality of through-holes and the multi-LED over-optic comprises at least one mounting post, and wherein the mounting post is configured to be positioned through one of the through-holes and extend beyond a bottom of the one through-hole to align the substrate with the multi-LED over-optic.

5. The illumination device of claim 4, wherein the substrate comprises four through-holes and the multi-LED over-optic comprises two mounting posts, and wherein the location of the four through-holes and two mounting posts are configured to allow the multi-LED over-optic to rotate relative to the substrate by positioning the two mounting posts in two of the four through-holes.

6. The illumination device of claim 4, further comprising a heat sink comprising:
    a mounting surface; and
    a plurality of fins extending away from the mounting surface;
    wherein the heat sink is removably coupled to the substrate and the multi-LED over-optic.

7. The illumination device of claim 6, wherein the heat sink comprises a plurality of mounting holes, each mounting hole configured to receive one of the mounting posts to releasably couple and align the heat sink with the substrate and the multi-LED module.

8. The illumination device of claim 7, wherein the heat sink further comprises a plurality of slots disposed along the mounting surface;
    wherein the substrate further comprises a plurality of mounting holes;
    wherein the multi-LED over-optic further comprises a plurality of mounting holes; and
    wherein when the at least one mounting hole of the heat sink receives the mounting posts of the multi-LED over-optic, the mounting holes of the substrate and the mounting holes of the multi-LED over-optic are aligned and at least a portion of the aligned mounting holes are aligned with at least one of the slots of the heat sink.

9. The illumination device of claim 1, wherein the LED coupling points are electrically coupled in series by the at least one electrical trace.

10. The illumination device of claim 1, wherein the at least one electrical trace comprises a plurality of sets of electrical traces, each set of electrical traces being electrically coupled to a portion of the LED coupling points.

11. The illumination device of claim 1, further comprising an electrical connector for receiving power for the LED coupling points, the electrical connector being electrically coupled to the at least one electrical trace.

12. The illumination device of claim 11, wherein the substrate comprises an aperture disposed at the center of the substrate for receiving an electrical wire configured to couple to the electrical connector.

13. The illumination device of claim 11, wherein the electrical connector comprises at least one electrical contact disposed on a bottom surface of the substrate for coupling to a power wire.

14. The illumination device of claim 11, wherein the electrical connector comprises two pins extending from a bottom surface of the substrate, the two pins configured to engage two sockets of an electrical connector electrically coupled to a power source.

15. The illumination device of claim 11, wherein the electrical connector comprises a TRS connector disposed at the center of the substrate and extending from a bottom side of the substrate, the TRS connector configured to engage a TRS socket electrically coupled to a power source.

16. The illumination device of claim 11, wherein the electrical connector comprises at least one pair of contacts, each of the at least one pair of contacts disposed on one side of the substrate, the at least one pair of contacts configured to make electrical contact with a pair of contacts coupled to a bus bar carrying electrical power.

17. The illumination device of claim 16, wherein the bus bar is disposed on an insulator bar positioned on a mounting surface of a heat sink, the insulator bar insulating the heat sink from the bus bar.

18. The illumination device of claim 1, wherein the substrate is comprised in a light bar.

19. A light module, comprising:
    a substrate;
    a plurality of LEDs coupled to the substrate; and
    a multi-LED over-optic comprising a base surface and a plurality of discrete over-optics, wherein each discrete over-optic has a substantially concave shape defining a cavity, the cavity having a closed end defined by the discrete over-optic and an open end facing towards the substrate, the closed end of the cavity of the discrete over-optic extending from the multi-LED over-optic in a direction away from the substrate, the cavity surrounded by the base surface, and wherein at least a portion of the base surface is in contact with the substrate in between at least two of the discrete over-optics, an internal volume is formed between another portion of the base surface and the substrate, wherein the cavities of the at least two discrete over-optics are in fluid communication via the internal volume, and wherein at least one of the plurality of LEDs is optically aligned with one of the cavities.

20. The light module of claim 19, wherein the internal volume forms a recess in the multi-LED over-optic.

21. The light module of claim 19, wherein the internal volume reduces susceptibility of the multi-LED over-optic to browning, burning out, failure, or any combination thereof.

22. The light module of claim 19, wherein an aperture is formed in the substrate, the aperture configured to receive at least two electrical wires.

23. The light module of claim 19, wherein the multi-LED over-optic comprises a raised cavity configured to receive at least a portion of an electrical connector.

24. A light module, comprising:
a substrate;
a plurality of LEDs coupled to the substrate;
a multi-LED over-optic comprising a plurality of discrete over-optics, wherein each discrete over-optic forms a cavity on a base surface of the multi-LED over optic, wherein at least a portion of the base surface is in direct contact with the substrate in between at least two of the discrete over-optics, wherein at least one of the plurality of LEDs is optically aligned with one of the cavities; and
a gasket material disposed on the base surface of the multi-LED over-optic forming a gas permeable seal between the multi-LED over-optic and the substrate while substantially blocking liquids or materials from entering an internal volume between the multi-LED optic and the substrate, wherein the multi-LED over-optic comprises a groove formed around the base surface configured to receive the gasket material, the groove intersecting one or more channels, the one or more channels intersecting one or more of the plurality of discrete over-optics.

* * * * *